US012288743B2

(12) United States Patent
Park et al.

(10) Patent No.: US 12,288,743 B2
(45) Date of Patent: Apr. 29, 2025

(54) SEMICONDUCTOR PACKAGE

(71) Applicant: SAMSUNG ELECTRONICS CO., LTD., Suwon-si (KR)

(72) Inventors: Junwoo Park, Asan-si (KR); Seunghwan Kim, Asan-si (KR); Jungjoo Kim, Daegu (KR); Yongkwan Lee, Gyeonggi-do (KR); Dongju Jang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 356 days.

(21) Appl. No.: 17/655,573

(22) Filed: Mar. 21, 2022

(65) Prior Publication Data
US 2022/0415778 A1 Dec. 29, 2022

(30) Foreign Application Priority Data

Jun. 25, 2021 (KR) .................. 10-2021-0082849

(51) Int. Cl.
*H01L 23/498* (2006.01)
*H01L 23/00* (2006.01)
*H01L 23/31* (2006.01)

(52) U.S. Cl.
CPC .... *H01L 23/49833* (2013.01); *H01L 23/3128* (2013.01); *H01L 24/16* (2013.01); *H01L 24/32* (2013.01); *H01L 24/73* (2013.01); *H01L 2224/16227* (2013.01); *H01L 2224/16235* (2013.01); *H01L 2224/32225* (2013.01); *H01L 2224/73204* (2013.01)

(58) Field of Classification Search
CPC ........... H01L 23/49833; H01L 23/3128; H01L 24/16; H01L 24/32; H01L 24/73; H01L 2224/16227; H01L 2224/16235; H01L 2224/32225; H01L 2224/73204; H01L 23/49811; H01L 23/562; H01L 23/5385; H01L 23/5389; H01L 25/105; H01L 23/13; H01L 23/481; H01L 24/19; H01L 2224/12105; H01L 2225/1035
See application file for complete search history.

(56) References Cited

U.S. PATENT DOCUMENTS 8,138,426 B2  3/2012  Matsuno et al.
8,766,424 B2  7/2014  Chung
(Continued)

FOREIGN PATENT DOCUMENTS

JP  2006222126  8/2006
JP  2006269772  10/2006
(Continued)

*Primary Examiner* — Douglas W Owens

(57) ABSTRACT

A semiconductor package includes a lower substrate that includes a lower wiring layer; a semiconductor chip disposed on the lower substrate, and an upper substrate disposed on the semiconductor chip. The upper substrate includes a lower surface that faces the semiconductor chip, an upper wiring layer, and a plurality of protruding structures disposed below the lower surface. The lower surface of the upper substrate includes a cavity region that overlaps the semiconductor chip in a first direction, and a plurality of channel regions that extend from the cavity region to an edge of the upper substrate. The cavity region and the plurality of channel regions are defined by the plurality of protruding structures.

19 Claims, 23 Drawing Sheets

(56) References Cited

U.S. PATENT DOCUMENTS

| | | | |
|---|---|---|---|
| 10,319,607 B2 | 6/2019 | Wu et al. | |
| 10,504,863 B2 | 12/2019 | Li et al. | |
| 2008/0111224 A1 | 5/2008 | Byun et al. | |
| 2016/0058119 A1 | 2/2016 | Hong | |
| 2017/0179078 A1 | 6/2017 | Jung et al. | |
| 2019/0035737 A1* | 1/2019 | Wu | H01L 21/4889 |
| 2020/0211956 A1* | 7/2020 | Wu | H01L 23/3128 |
| 2021/0020560 A1* | 1/2021 | Wang | H01L 24/20 |
| 2022/0209391 A1* | 6/2022 | Tang | H01L 23/4334 |
| 2022/0328388 A1* | 10/2022 | Hwang | H01L 23/49833 |

FOREIGN PATENT DOCUMENTS

| | | |
|---|---|---|
| KR | 10-2017-0075125 | 7/2017 |
| KR | 20190074193 A | 6/2019 |
| KR | 20210073958 A | 6/2021 |

\* cited by examiner

SEMICONDUCTOR PACKAGE

CROSS-REFERENCE TO RELATED APPLICATION

This application claims priority under 35 U.S.C. § 119 from Korean Patent Application No. 10-2021-0082849, filed on Jun. 25, 2021 in the Korean Intellectual Property Office, the contents of which are herein incorporated by reference in their entirety.

TECHNICAL FIELD

Embodiments of the present inventive concept are directed to a semiconductor package.

DISCUSSION OF RELATED ART

As electronic devices achieve higher performance and become more miniaturized, a package-on-package (POP) technology has been developed in the semiconductor packaging field. In a package-on-package technology, since two or more semiconductor packages are vertically stacked, a technology for minimizing the thickness of the final package structure is needed.

SUMMARY

An embodiment of the present inventive concept provides a semiconductor package having a minimized thickness.

According to an embodiment of the present inventive concept, a semiconductor package includes: a lower substrate that including a lower wiring layer; a semiconductor chip disposed on the lower substrate, where the semiconductor chip is electrically connected to the lower wiring layer; an upper substrate disposed on the semiconductor chip, where the upper substrate includes a lower surface that faces the semiconductor chip, an upper wiring layer, and a plurality of protruding structures disposed below the lower surface; a connection structure disposed between the lower substrate and the upper substrate, where the connection structure electrically connects the lower wiring layer and the upper wiring layer; an encapsulant that fills a space between the lower substrate and the upper substrate, where the encapsulant seals at least a portion of each of the semiconductor chip and the connection structure; and a connection bump disposed below the lower substrate, where the connection bump is electrically connected to the lower wiring layer. The lower surface of the upper substrate includes a cavity region that overlaps the semiconductor chip in a first direction that is perpendicular to the lower surface, and a plurality of channel regions that extend from the cavity region to an edge of the upper substrate. The cavity region and the plurality of channel regions are defined by the plurality of protruding structures.

According to an embodiment of the present inventive concept, a semiconductor package includes: a lower substrate that includes a lower wiring layer; a semiconductor chip disposed on the lower substrate, where the semiconductor chip is electrically connected to the lower wiring layer; an upper substrate disposed on the semiconductor chip, where the upper substrate includes a lower surface that faces the semiconductor chip, an upper wiring layer, and a plurality of protruding structures disposed below the lower surface; and a connection structure disposed between the lower substrate and the upper substrate, where the connection structure electrically connects the lower wiring layer and the upper wiring layer. The lower surface of the upper substrate includes a cavity region surrounded by the plurality of protruding structures, and a plurality of channel regions extend from the cavity region to an edge of the upper substrate and pass between the plurality of protruding structures.

According to an embodiment of the present inventive concept, a semiconductor package includes: a lower substrate; a semiconductor chip disposed on the lower substrate; an upper substrate disposed on the semiconductor chip, where the upper substrate includes a lower surface that faces the semiconductor chip, and a plurality of protruding structures disposed below the lower surface that do not overlap the semiconductor chip in a first direction that is perpendicular to the lower surface; and a connection structure disposed below the plurality of protruding structures, where the connection structure extends in the first direction and electrically connects the upper substrate and the lower substrate.

DETAILED DESCRIPTION

Hereinafter, preferred exemplary embodiments of the present inventive concept will be described with reference to the accompanying drawings as follows.

The term "about" as used herein is inclusive of the stated value and means within an acceptable range of deviation for the particular value as determined by one of ordinary skill in the art, considering the measurement in question and the error associated with measurement of the particular quantity, such as the limitations of the measurement system. For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art.

Figure 1A:
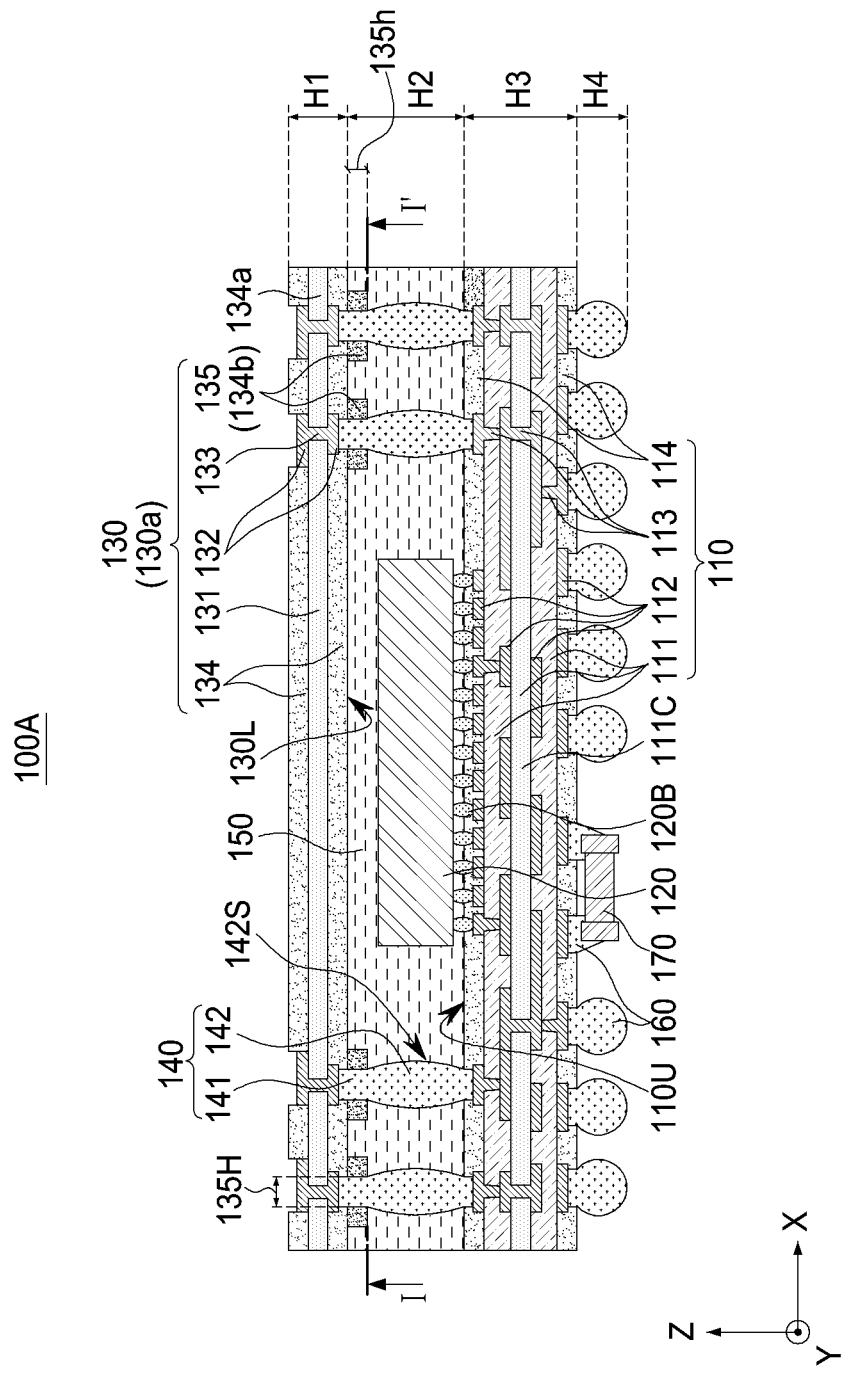
FIGS. 1A and 1B are cross-sectional views of a semiconductor package according to an exemplary embodiment of the present inventive concept.
Figure 1B:
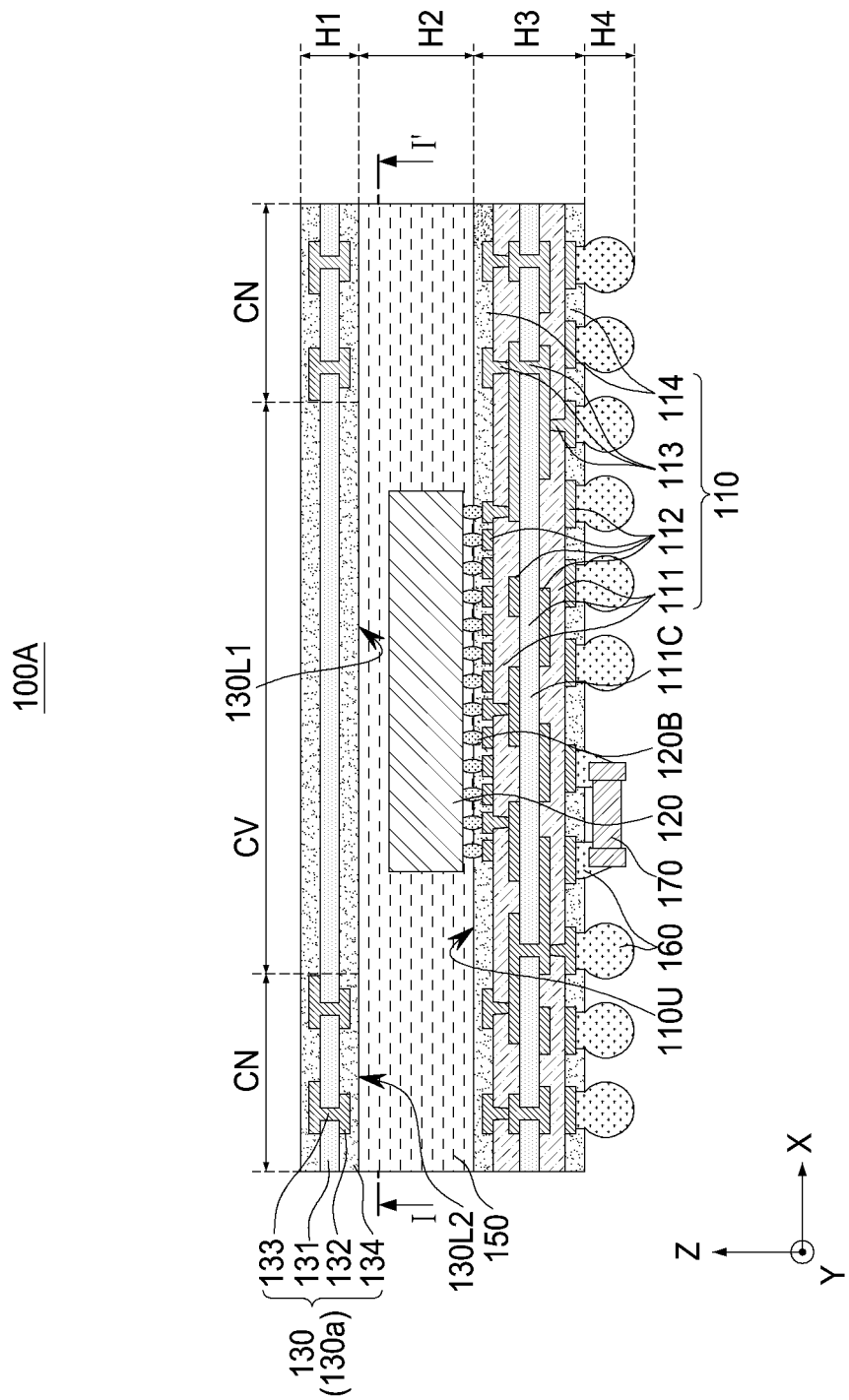
Figure 1C:
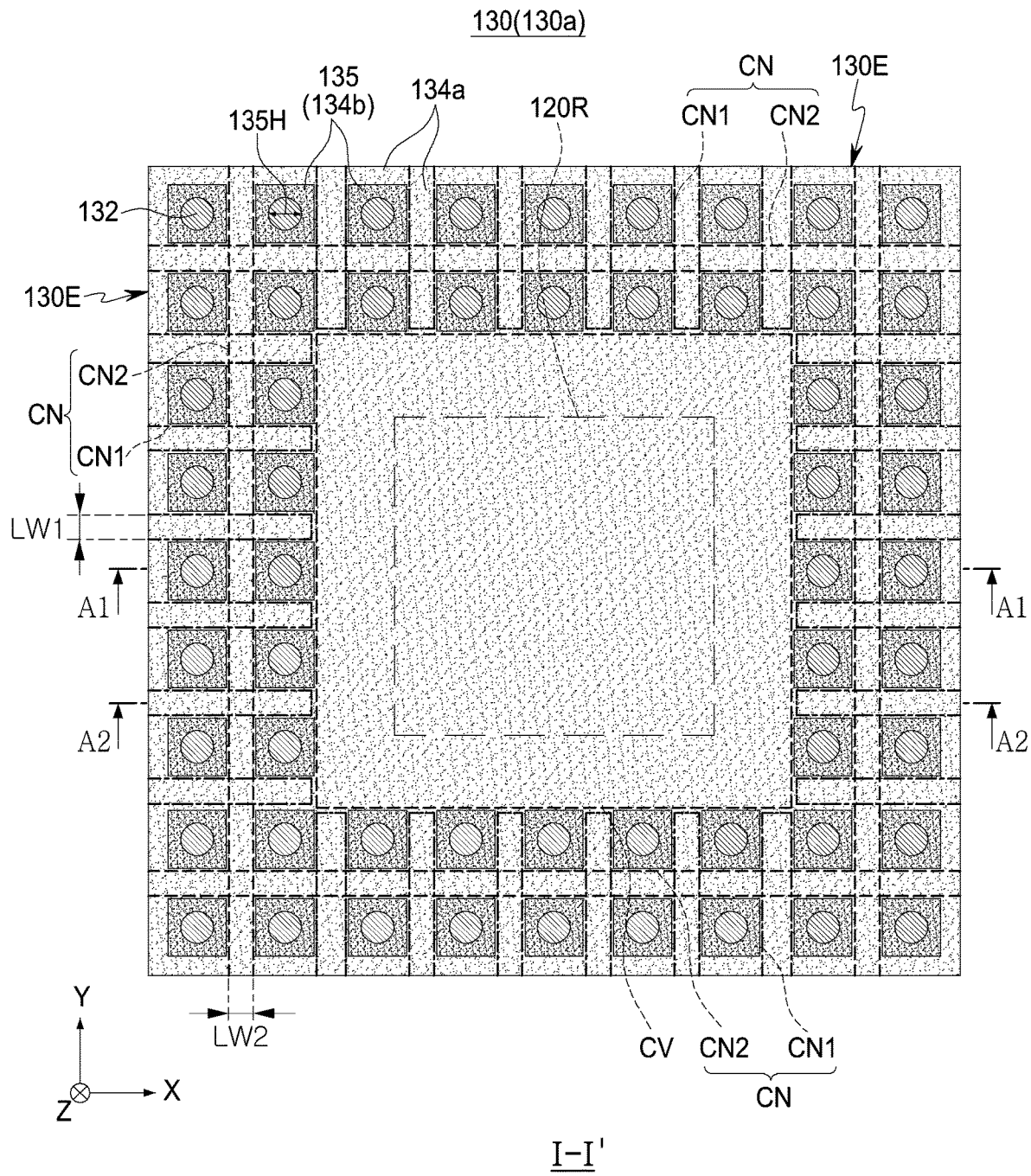
FIG. 1C is a cross-sectional plan view taken along line I-I' in FIGS. 1A and 1B.
Figure 1D:
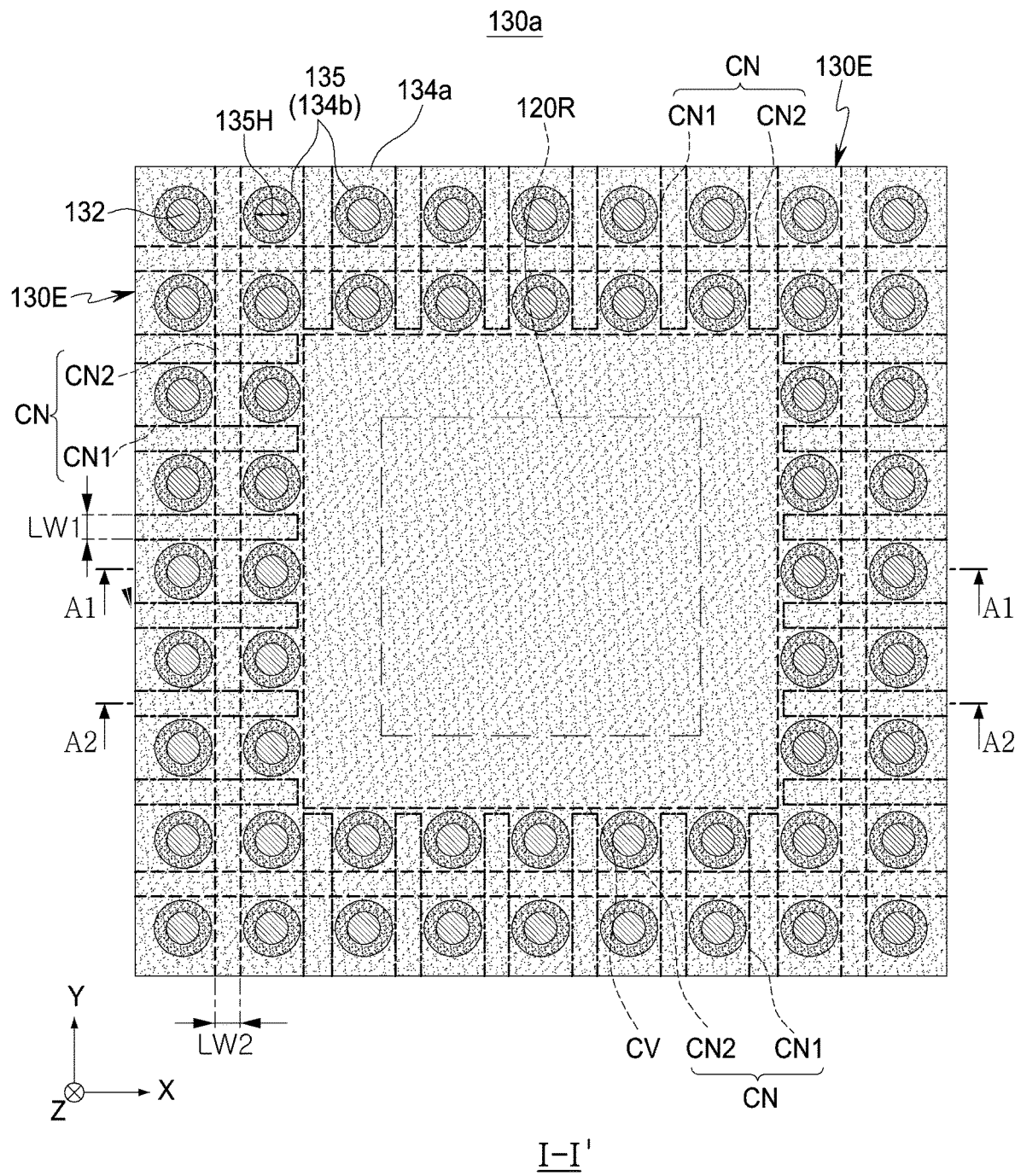
FIG. 1D is a plan view of an exemplary modification of an upper substrate of FIG. 1C.

FIGS. 1A and 1B are cross-sectional views of a semiconductor package 100A according to an exemplary embodiment of the present inventive concept, FIG. 1C is a plan view taken along line I-I' in FIGS. 1A and 1B, and FIG. 1D is a plan view of a modified example of the upper substrate 130a1 of FIG. 1C. FIG. 1C illustrates a lower surface 130L of an upper substrate 130 except for some components to illustrate a dispositional relationship between a cavity region CV and a plurality of channel regions CN. FIGS. 1A and 1B are a cross-sectional views of an upper substrate 130 taken along lines A1-A1' and A2-A2' of FIG. 1C, respectively.

Referring to FIGS. 1A to 1D, a semiconductor package 100A according to an exemplary embodiment includes a lower substrate 110, a semiconductor chip 120, an upper substrate 130, and a connection structure 140. In addition, the semiconductor package 100A may further include an encapsulant 150, a connection bump 160, and/or a passive element 170.

In a present inventive concept, a joint pitch and a ball size are reduced by introducing a cavity region CV defined by a plurality of protruding structures 135 on a lower surface 130L of an upper substrate 130 of the semiconductor package 100A. As a result, a height of the semiconductor package 100A is reduced and a fine pitch is implemented. Here, the joint pitch is defined as a height of a body portion 142 of the connection structure 140, the ball size is defined as a maximum width of the connection structure 140 in a horizontal direction, and the fine pitch is defined as an interval between adjacent connection structures 140. In addition, according to a present inventive concept, by introducing a plurality of channel regions CN between a plurality of protruding structures 135 on the lower surface 130L of the upper substrate 130, a distribution path can be secured for a cleaning solution, such as DI water, in a flux cleaning process after a reflow process that forms the connection structure 140, and an entry path can be secured for a molding resin. such as EMC, in a molding process that forms the encapsulant 150. Accordingly, a flux that remains inside the cavity region CV can be removed and the molding resin can be smoothly filled. Hereinafter, each component will be described in detail with reference to the drawings.

The lower substrate 110 is a support substrate on which the semiconductor chip 120 is mounted, and includes a lower wiring layer 112 that rewires the semiconductor chip 120. The substrate may be one of a printed circuit board (PCB), a ceramic substrate, a glass substrate, or a tape wiring board, etc. For example, the lower substrate 110 includes an insulating layer 111, a lower wiring layer 112, and a lower wiring via 113.

The insulating layer 111 includes an insulating resin. The insulating resin includes at least one of a thermosetting resin such as an epoxy resin, a thermoplastic resin such as polyimide, or a resin impregnated with inorganic fillers or/and glass fibers, such as glass fiber, glass cloth, or glass fabric in these resins, such as prepreg, Ajinomoto Build-up Film (ABF), FR-4, Bismaleimide Triazine (BT), or a photosensitive resin such as a photoimageable dielectric (PID). The insulating layer 111 includes a plurality of insulating layers 111 stacked in a first (Z-axis) direction. Depending on the process, a boundary between the different insulating layers 111 may be unclear. In addition, for convenience of illustration, only three insulating layers 111 are illustrated in the drawings, but exemplary embodiments of the present inventive concept are not limited thereto. According to an exemplary embodiment, a lesser or greater number of insulating layers 111 than shown in the drawings may be formed. In addition, a core insulating layer 111C located in a middle of the plurality of insulating layers 111 is thicker than the insulating layers 111 stacked thereabove and therebelow. The core insulating layer 111C improves rigidity of the substrate to suppress warpage of the substrate. The core insulating layer 111C is formed using, for example, at least one of a copper clad laminate (CCL), an unclad copper clad laminate (Unclad CCL), a glass substrate or a ceramic substrate. According to an exemplary embodiment, the lower substrate 110 does not include the core insulating layer 111C, (please refer to an exemplary embodiment of FIG. 7).

The lower wiring layer 112 includes, for example, at least one of copper (Cu), aluminum (Al), silver (Ag), tin (Sn), gold (Au), nickel (Ni), lead (Pb), titanium (Ti), or a metal including alloys thereof. The lower wiring layer 112 includes, for example, a ground (GND) pattern, a power (PWR) pattern, or a signal (S) pattern. The ground (GND) pattern and the power (PWR) pattern provide paths through which a ground signal and a power signal, respectively, are transmitted/received. The signal (S) pattern provides a path through which various signals, such as a data signal, etc., is transmitted/received. The lower wiring layer 112 includes a plurality of lower wiring layers 112 respectively disposed below the plurality of insulating layers 111. The plurality of lower wiring layers 112 are electrically connected to each other through a wiring via 113. The lower wiring layer 112 includes a landing pad on which a semiconductor chip 120, a connection structure 140, a connection bump 160, and a passive element 170 are mounted, respectively. The landing pads have a different pitch depending on the mounted object. For example, a lowermost lower wiring layer 112 in contact with the connection bump 160 has a greater thickness than the lower wiring layers 112 disposed thereabove. The number of layers of the lower wiring layer 112 is determined based on the number of layers of the insulating layer 111, and may include more or fewer layers than shown in the drawings. The lower substrate 110 further includes a solder resist layer 114 that covers the uppermost and lowermost lower wiring layers 112, and protects them from external physical/chemical damages. The solder resist layer 114 includes an insulating material, and is formed using, for example, prepreg, ABF, FR-4, BT, or a photo solder resist (PSR). The solder resist layer 114 has an opening that exposes at least a portion of the lower wiring layer 112.

The wiring via 113 is electrically connected to the lower wiring layer 112, and includes a signal via, a ground via, and a power via. The wiring via 113 includes, for example, at least one of copper (Cu), aluminum (Al), silver (Ag), tin (Sn), gold (Au), nickel (Ni), lead (Pb), titanium (Ti), or a metal including alloys thereof. The wiring via 113 is a filled via in which a metal is filled in a via hole, or is a conformal via in which a metal is formed along an inner wall of the via hole. The wiring via 113 is integrated with the lower wiring layer 112, but exemplary embodiments of the present inventive concept are not limited thereto.

The semiconductor chip 120 is disposed on the lower substrate 110, and is electrically connected to the lower wiring layer 112. The semiconductor chip 120 is mounted on the lower substrate 110 by a flip-chip method. The semiconductor chip 120 is connected to the lower wiring layer 112 through a metal bump in a form of a ball or a post. For example, the semiconductor chip 120 is electrically connected to the lower wiring layer 112 through a solder bump 120B, but embodiments are not limited thereto. According to exemplary embodiments, the semiconductor chip 120 is directly connected to the lower wiring layer 112 or a wiring via 113 without a separate bump, or is mounted on the lower substrate 110 by wire bonding. The semiconductor chip 120 includes at least one of silicon (Si), germanium (Ge), or gallium arsenide (GaAs), and various types of integrated circuits may be formed therein. The integrated circuit may be a processor chip such as a central processor (e.g., CPU), a graphics processor (e.g., GPU), a field programmable gate array (FPGA), an application processor (AP), a digital signal processor (DSP), a cryptographic processor, or a microprocessor, etc., but embodiments are not limited thereto, and the integrated circuit may a logic chip such as a central processor (CPU), a graphics processor (GPU), a field programmable gate array (FPGA), a digital signal processor (DSP), an encryption processor, a microprocessor, a microcontroller, an analog-digital converter, an application-specific IC (ASIC), or a memory chip such as a volatile memory, such as a DRAM, or a non-volatile memory, such as a ROM or a flash memory.

The upper substrate 130 is a redistribution layer in an upper portion or a rear surface of the semiconductor package 100A, and may be referred to as an interposer substrate that is located between a lower package and an upper package in a package-on-package structure. The upper substrate 130 includes a lower surface 130L that faces the semiconductor chip 120, an insulating layer 131, an upper wiring layer 132, a wiring via 133, and a plurality of protruding structures 135. The insulating layer 131, the upper wiring layer 132, and the wiring via 133 have the same or similar characteristics to the insulating layer 111, the lower wiring layer 112, and the wiring via 113 of the lower substrate 110 described above, and thus overlapping descriptions thereof will be omitted. In addition, the upper substrate 130 further includes a solder resist layer 134 that covers the uppermost and the lowermost upper wiring layers 132 to protect them from external physical/chemical damage, and is formed using, for example, ABF, FR-4, BT, or PSR.

In an embodiment of the present inventive concept, by introducing a cavity region CV and a plurality of channel regions CN that are defined by a plurality of protruding structures 135 on the lower surface 130L of the upper substrate 130, an overall height of the semiconductor package 100A and a pitch of the connection structure 140 can be reduced, and a distribution path of a flux cleaning solution and an encapsulant is secured that increases an efficiency of a molding process and improves a yield of a packaging process. The cavity region CV and the plurality of channel regions CN are defined regardless of a planar shape of the plurality of protruding structures 135. For example, as illustrated in FIG. 1D, even when the plurality of protruding structures 135 have a circular shape in a XY plane, the cavity region CV and the plurality of channel regions CN can be defined similar to those described below.

The plurality of protruding structures 135 protrude below the lower surface 130L of the upper substrate 130 into the encapsulant 150, and are disposed below the lower surface 130L so as not to overlap the semiconductor chip 120 in the first (Z-axis) direction, perpendicular to the lower surface 130L. In this case, the cavity region CV is surrounded by the plurality of protruding structures 135, and the plurality of channel regions CN are located between the plurality of protruding structures 135 spaced apart from each other (see FIG. 1C). At least a portion of the cavity region CV overlaps the semiconductor chip 120 in the first (Z-axis) direction (Z-axis direction). For example, the cavity region CV has a larger planar area than the semiconductor chip 120, and a semiconductor chip region ('120R' in FIG. 1C) that overlaps the semiconductor chip 120 in the first (Z-axis) direction is located on an XY plane (see FIG. 1C). The plurality of channel regions CN extend from the cavity region CV to an edge 130E of the upper substrate 130 while passing between the plurality of protruding structures 135. In addition, the plurality of channel regions CN have a floor height, which is the height H2 between the upper substrate 130 and the lower substrate 110, that is substantially equal to or higher than that of the cavity region CV in the first (Z-axis) direction to improve the flux cleaning effect and encapsulant filling properties of the cavity region CV. In FIG. 1A, the height H2 of channel regions CN is equal to than that of the cavity region CV, and in FIG. 2A, the height H2 of channel regions CN is higher than that of the cavity region CV. For example, the lower surface 130L of the upper substrate 130 includes a first surface 130L1 that corresponds to the cavity region CV and a second surface 130L2 that corresponds to the plurality of channel regions CN, and the first surface 130L1 and the second surface 130L2 are substantially coplanar (see FIG. 1B).

As illustrated in FIG. 1C, in an embodiment, the plurality of channel regions CN include a plurality of first channel regions CN1 that extend from the cavity region CV toward the edge 130E of the upper substrate 130, and a plurality of second channel regions CN2 that intersect the plurality of first channel regions CN1. As described above, to secure a distribution path of the flux cleaning solution and the encapsulant, at least one end of each of the plurality of first and second channel regions CN1 and CN2 extends to the edge 130E of the upper substrate 130. To smoothly pass a filter included in the encapsulant 150, the plurality of first channel regions CN1 each have a line width LW1 in a range from about 2 µm to about 70 µm, from about 2 µm to about 50 µm, or from about 2 µm to about 40 µm. When the line width LW1 of each of the plurality of first channel regions CN1 is less than about 2 µm, the distribution of the encapsulant 150 is not smooth. When the line width LW1 of each of the plurality of first channel regions CN1 exceeds about 70 µm, a connection structure 140 that has a fine pitch might not be formed. The plurality of second channel regions CN2 each have a line width LW2 in the same range as the line width LW1 of each of the plurality of first channel regions CN1, but the line width LW2 does not have to be equal to the line width LW1 of each of the plurality of first channel regions CN1. According to exemplary embodiments, the plurality of second channel regions CN2 are omitted.

In a present exemplary embodiment, the plurality of protruding structures 135 are formed by patterning a plurality of solder resist layers 134a and 134b that are sequentially stacked on the lower surface 130L of the upper substrate 130a. For example, the upper substrate 130a includes a first solder resist layer 134a disposed below the insulating layer 131 and that provides the lower surface 130L of the upper substrate 130a, and a second solder resist layer 134b disposed below the first solder resist layer 134a and that provides the plurality of protruding structures 135. In this case, the cavity region CV is that in which the first solder resist layer 134a is exposed in a central portion of the upper substrate 130a and surrounded by the plurality of protruding structures 135. In addition, the plurality of channel regions CN extend from the cavity region V to separate the second solder resist layer 134b into a plurality of protruding structures 135, and have a trench shape that exposes the first solder resist layer 134a or the insulating layer 131 thereabove.

The connection structure 140 is disposed below at least some of the plurality of protruding structures 135, and extends in the first (Z-axis) direction and electrically connects the upper substrate 130 and the lower substrate 110. The connection structure 140 is disposed between the lower substrate 110 and the upper substrate 130, and provides a vertical connection path that electrically connects the lower wiring layer 112 and the upper wiring layer 132. The connection structure 140 has a spherical or ball shape made of a low-melting-point metal such as tin (Sn), indium (In), bismuth (Bi), antimony (Sb), copper (Cu), silver (Ag), zinc (Zn), lead (Pb), or an alloy (e.g., Sn—Ag—Cu) thereof.

In an exemplary embodiment, the connection structure 140 corresponds to each of the plurality of protruding structures 135. For example, at least a portion of the plurality of protruding structures 135 includes an opening 135H that exposes at least a portion of the upper wiring layer 132, and the connection structure 140 is disposed below at least a portion of the plurality of protruding structures 135, and is electrically connected to the upper wiring layer 132 through the opening 135H. In this case, the connection structure 140 includes a contact portion 141 that fills the opening 135H, and a body portion 142 that extends from the contact portion 141 to an upper surface 110U of the lower substrate 110, and the body portion 142 has a convex side surface 142S whose a maximum width in a second (e.g., X-axis) direction is greater than a maximum width of the contact portion 141 (see FIG. 1A).

According to an embodiment of the present inventive concept, by introducing a plurality of protruding structures 135 on the lower surface 130L of the upper substrate 130, a joint pitch for electrical connection between the lower substrate 110 and a ball size of the connection structure 140 can be reduced. Accordingly, a fine pitch can be implemented even in a package-on-package structure that uses an interposer substrate and at the same time, an entire height of the package structure can be reduced.

The encapsulant 150 fills a space between the lower substrate 110 and the upper substrate 130, and encapsulates at least a portion of each of the semiconductor chip 120 and the connection structure 140. The encapsulant 150 includes at least one of a thermosetting insulating resin such as an epoxy resin, a thermoplastic insulating resin such as a polyimide, or a prepreg that includes an inorganic filler and/or a glass fiber, an Ajinomoto Build-up Film (ABF), FR-4, a bismaleimide triazine (BT) resin, an epoxy molding compound (EMC), etc. The encapsulant 150 has a molded underfill (MUF) structure integrally formed with an underfill resin that is interposed between the semiconductor chip 120 and the lower substrate 110, but embodiments are not limited thereto. In some exemplary embodiments, the encapsulant 150 has a capillary underfill (CUF) structure with a separate underfill resin under the semiconductor chip 120. According to an embodiment of the present inventive concept, impurities, such as flux residues, in the cavity region CV are removed and the encapsulant 150 smoothly fills through the plurality of channel regions CN. Therefore, even when a molding resin is filled between the lower substrate 110 and the upper substrate 130, impurities or voids are prevented from forming in the encapsulant 150 to secure the quality of the encapsulant 150.

The connection bump 160 is disposed below the lower substrate 110, and is electrically connected to the lower wiring layer 112. The connection bump 160 physically and/or electrically connects the semiconductor package 100A to an external device. The connection bump 160 includes a conductive material and has a ball, pin, or lead shape. In an embodiment, the connection bump 160 is a solder ball. In an embodiment, at least one passive element 170 is disposed below the lower substrate 110 adjacent to the connection bump 160. The passive element 170 includes, for example, one of a capacitor such as a Multi Layer Ceramic Capacitor (MLCC) or a Low Inductance Chip Capacitor (LICC), an inductor, or beads. In an embodiment, the passive element 170 is a land-side capacitor (LSC). However, embodiments of the present inventive concept are not limited thereto, and in other embodiments, the passive element 170 is a Die-Side Capacitor (DSC) mounted on the upper surface of the lower substrate 110 or an embedded-type capacitor embedded in the lower substrate 110.

As described above, according to an embodiment of the present inventive concept, by introducing a cavity region CV and a plurality of channel regions CN defined by a plurality of protruding structures 135 in the lower surface 130L of the upper substrate 130, a pitch of the connection structure 140 and an overall height of the semiconductor package 100A is reduced. For example, according to exemplary embodiments of the present inventive concept, in a first (Z-axis) direction, a height H1 from an upper surface to a lower surface of the upper substrate 130 is in a range of from about 0.075 mm to about 0.085 mm, a height H2 between the upper substrate 130 and the lower substrate 110 is in a range of from about 0.135 mm to about 0.165 mm, a height H3 from the upper surface to the lower surface of the lower substrate 110 is in a range of from about 0.085 mm to about 0.095 mm, and a height H4 of the connecting bump 160 is in a range of from about 0.125 mm to about 0.135 mm. Accordingly, the semiconductor package 100A according to an exemplary embodiment has a height in a range of from about 0.42 mm to about 0.48 mm.

In addition, in an embodiment of the present inventive concept, by introducing a plurality of protruding structures 135 on the lower surface 130L of the upper substrate 130, a joint pitch and a ball size for electrical connection between the lower substrate 110 and the upper substrate 130 are reduced. In this regard, a height 135h of the plurality of protruding structures 135 is in a range of from about 0.01 mm to about 0.02 mm. When the height 135h of the plurality of protruding structures 135 is less than about 0.01 mm, an effect of reducing the joint pitch and ball size is insignificant, and when the height thereof exceeds about 0.02 mm, flowability of the encapsulant 150 can be inhibited or warpage might not be controlled.

Figure 2A:
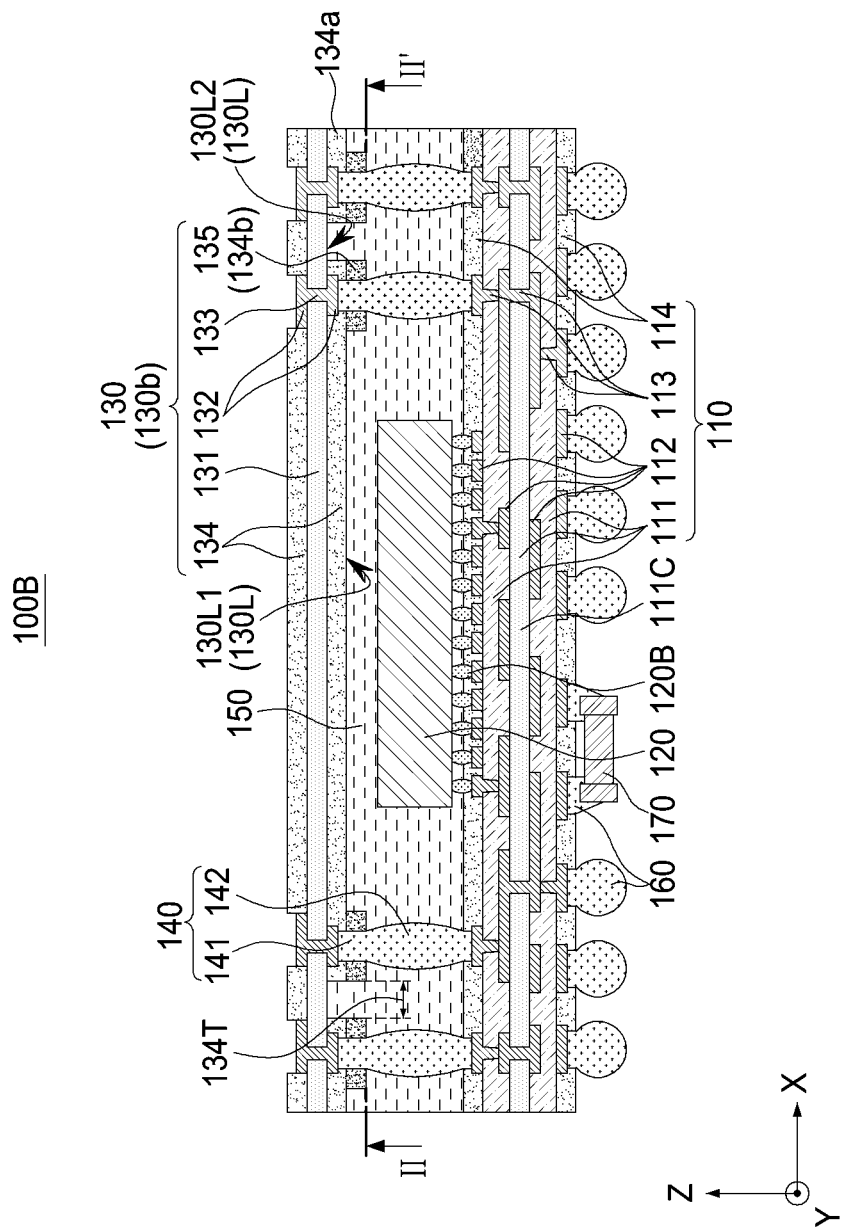
FIG. 2A is a cross-sectional view of a semiconductor package according to an exemplary embodiment of the present inventive concept.
Figure 2B:
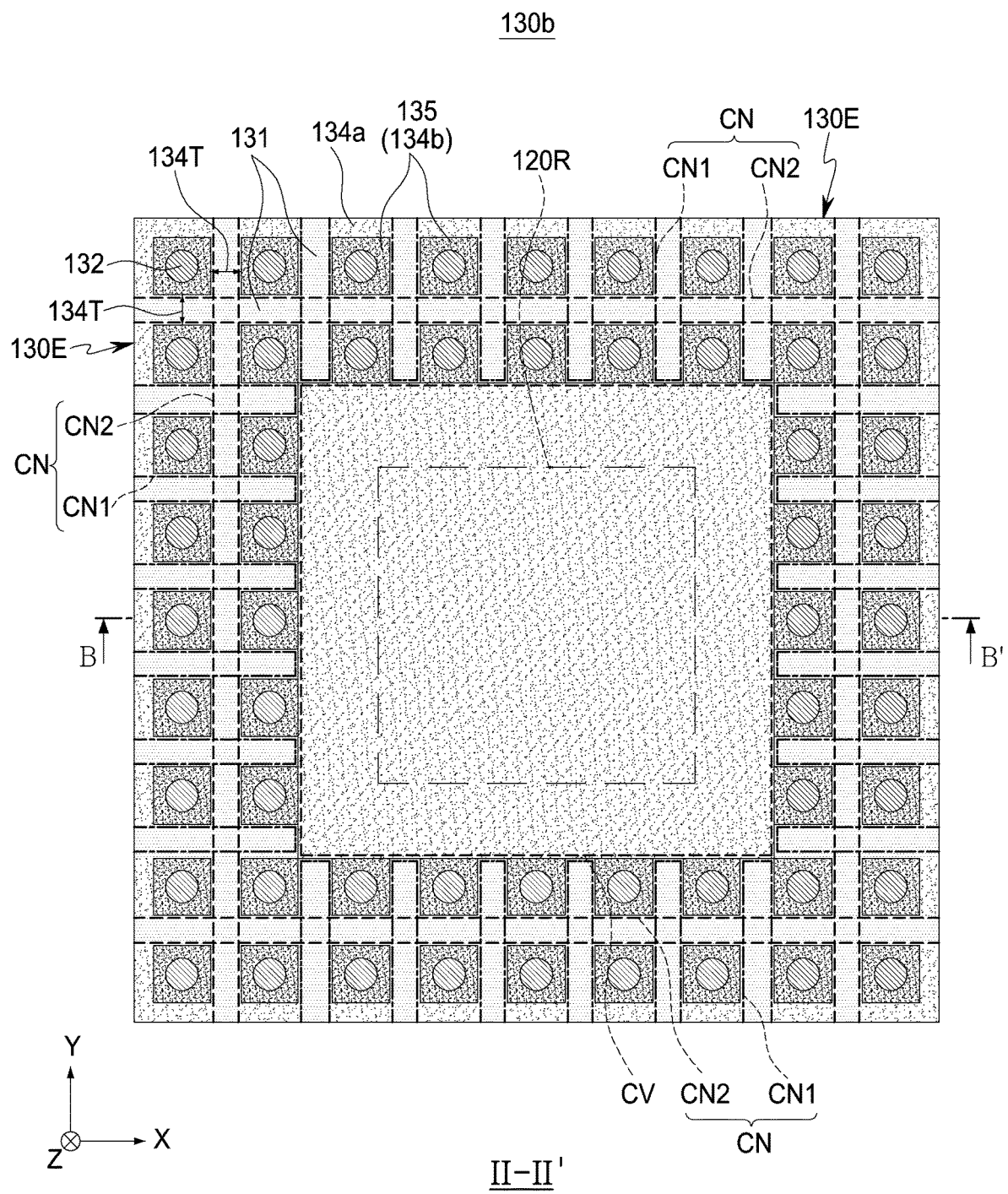
FIG. 2B is a plan view taken along line II-II' in FIG. 2A.

FIG. 2A is a cross-sectional view of a semiconductor package 100B according to an exemplary embodiment of the present inventive concept, and FIG. 2B is a plan view taken along line II-II'. FIG. 2B illustrates a lower surface 130L of an upper substrate 130b, similar to FIG. 1C, to illustrate a dispositional relationship between a cavity region CV and a plurality of channel regions CN. FIG. 2A is a cross-section of the upper substrate 130b taken along line B-B' of FIG. 2B.

Referring to FIGS. 2A and 2B, the semiconductor package 100B according to an exemplary embodiment has the same or similar characteristics as those described with reference to FIGS. 1A to 1D except that a lower surface 130L, or a first surface 130L1, of the upper substrate 130b that corresponds to a cavity region CV is located lower than a lower surface 130L or a second surface 130L2 of the upper substrate 130b that corresponds to a plurality of channel regions CN. In an exemplary embodiment, the plurality of channel regions CN have a higher floor height in a first (Z-axis) direction than the cavity region CV to further improve a flux cleaning effect in the cavity region CV and filling properties of an encapsulant 150. For example, the second surface 130L2 of the upper substrate 130b that corresponds to the plurality of channel regions CN is located higher than the first surface 130L1 of the upper substrate 130b that corresponds to the cavity region CV.

In a present exemplary embodiment, a plurality of protruding structures 135 are formed by patterning a plurality of solder resist layers 134a and 134b that are sequentially stacked on a lower surface 130L of an upper substrate 130b. For example, the upper substrate 130b includes a first solder resist layer 134a disposed below the insulating layer 131 and that provides a lower surface 130L of the upper substrate 130b, and a second solder resist layer 134b disposed below the first solder resist layer 134a, and that provides a plurality of protruding structures 135. In this case, the cavity region CV is where the first solder resist layer 134a is exposed in a central portion of the upper substrate 130b that is surrounded by the plurality of protruding structures 135. In addition, the plurality of channel regions CN extend from the cavity region CV and separate the second solder resist layer 134b into a plurality of protruding structures 135, and further have a form of a trench 134T that penetrates the first solder resist layer 134a and exposes the insulating layer 131.

Figure 3A:
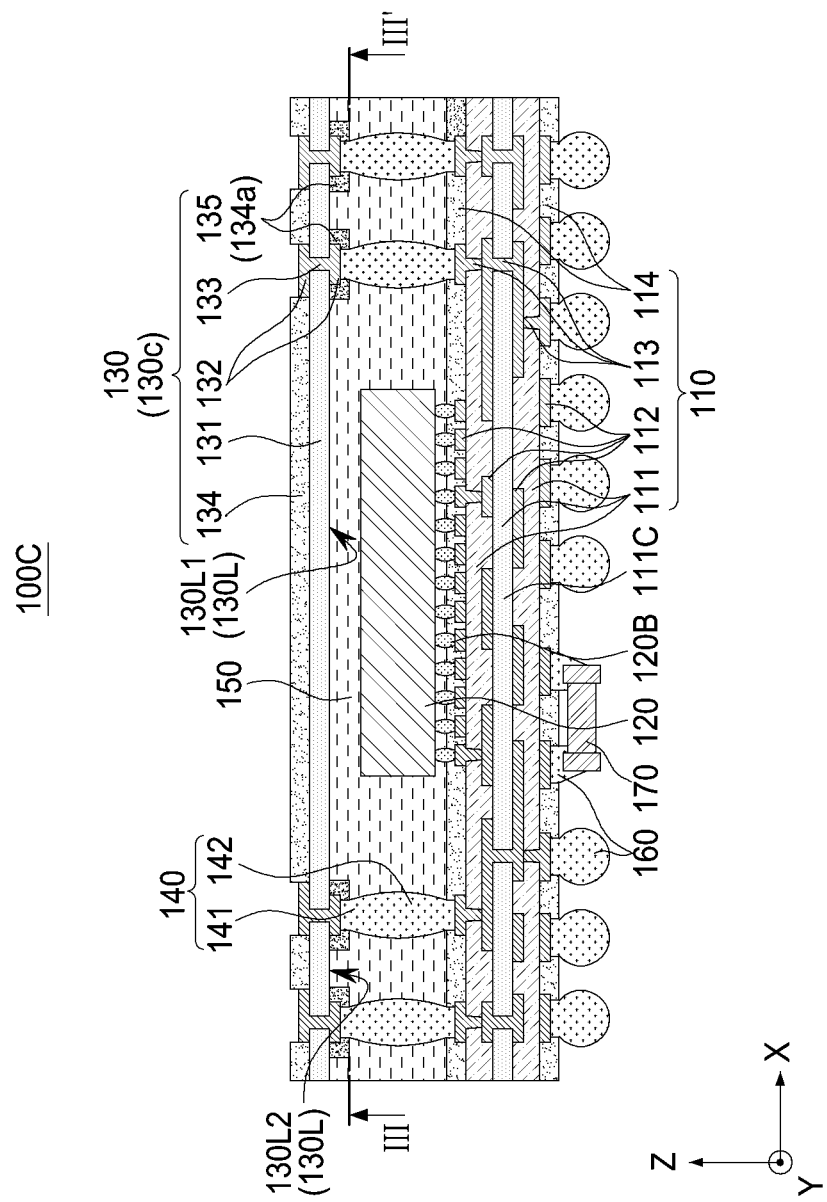
FIG. 3A is a cross-sectional view of a semiconductor package according to an exemplary embodiment of the present inventive concept.
Figure 3B:
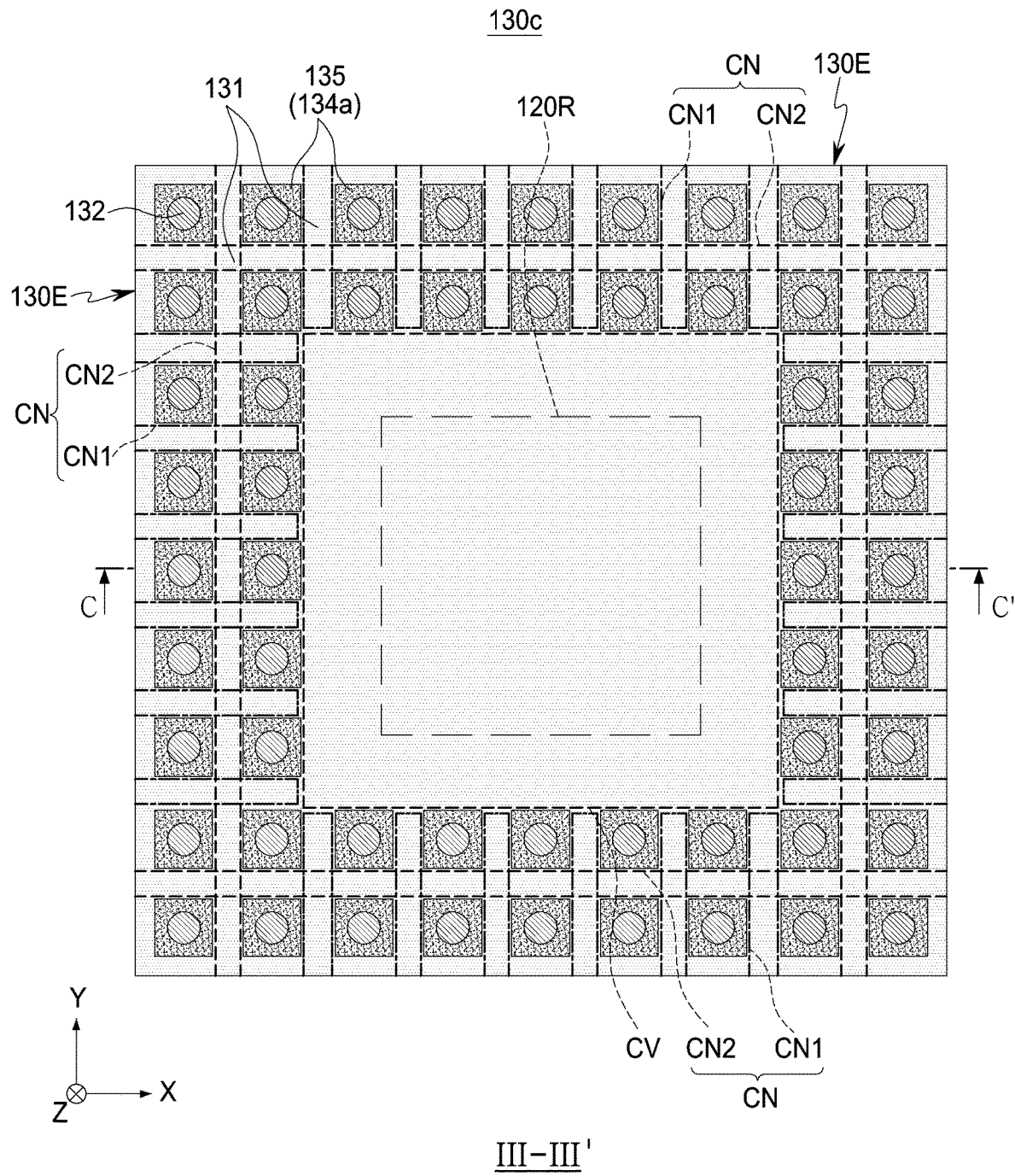
FIG. 3B is a plan view taken along line III-III' of FIG. 3A.

FIG. 3A is a cross-sectional view of a semiconductor package 100C according to an exemplary embodiment of the present inventive concept, and FIG. 3B is a plan view taken along line III-III' of FIG. 3A. FIG. 3B illustrates a lower surface 130L of an upper substrate 130c, similar to FIG. 1C, to illustrate a dispositional relationship between a cavity region CV and a plurality of channel regions CN. FIG. 3A is a cross-section of the upper substrate 130c taken along line C-C' of FIG. 3B.

Referring to FIGS. 3A and 3B, the semiconductor package 100C according to an exemplary embodiment has the same or similar characteristics as those described with reference to FIGS. 1A to 2B, except that a solder resist layer 134a is formed as a single layer below the upper substrate 130c. Compared to the semiconductor packages 100A and 100B of the above-described exemplary embodiments, since the upper substrate 130c of the semiconductor package 100C according to an exemplary embodiment has a reduced height, an overall height of the semiconductor package 100c is further reduced.

In a present exemplary embodiment, a plurality of protruding structures 135 are formed by patterning the solder resist layer 134a stacked on the lower surface 130L of the upper substrate 130c. For example, the upper substrate 130c includes an insulating layer 131 that provides a lower surface 130L thereof and a solder resist layer 134a disposed below the insulating layer 131 and that provides a plurality of protruding structures 135. In this case, a cavity region CV is where the insulating layer 131 is exposed in a central portion of the upper substrate 130c surrounded by the plurality of protruding structures 135. In addition, the plurality of channel regions CN have a trench form that extends from the cavity region CV that separate a first solder resist layer 134a into a plurality of protruding structures 135 and expose an insulating layer 131. Accordingly, the plurality of protruding structures 135 are directly disposed on a lower surface of the insulating layer 131, and a flux cleaning effect in the cavity region CV and filling properties of an encapsulant 150 through the plurality of channel regions CN between the plurality of protruding structures 135 are improved.

Figure 4A:
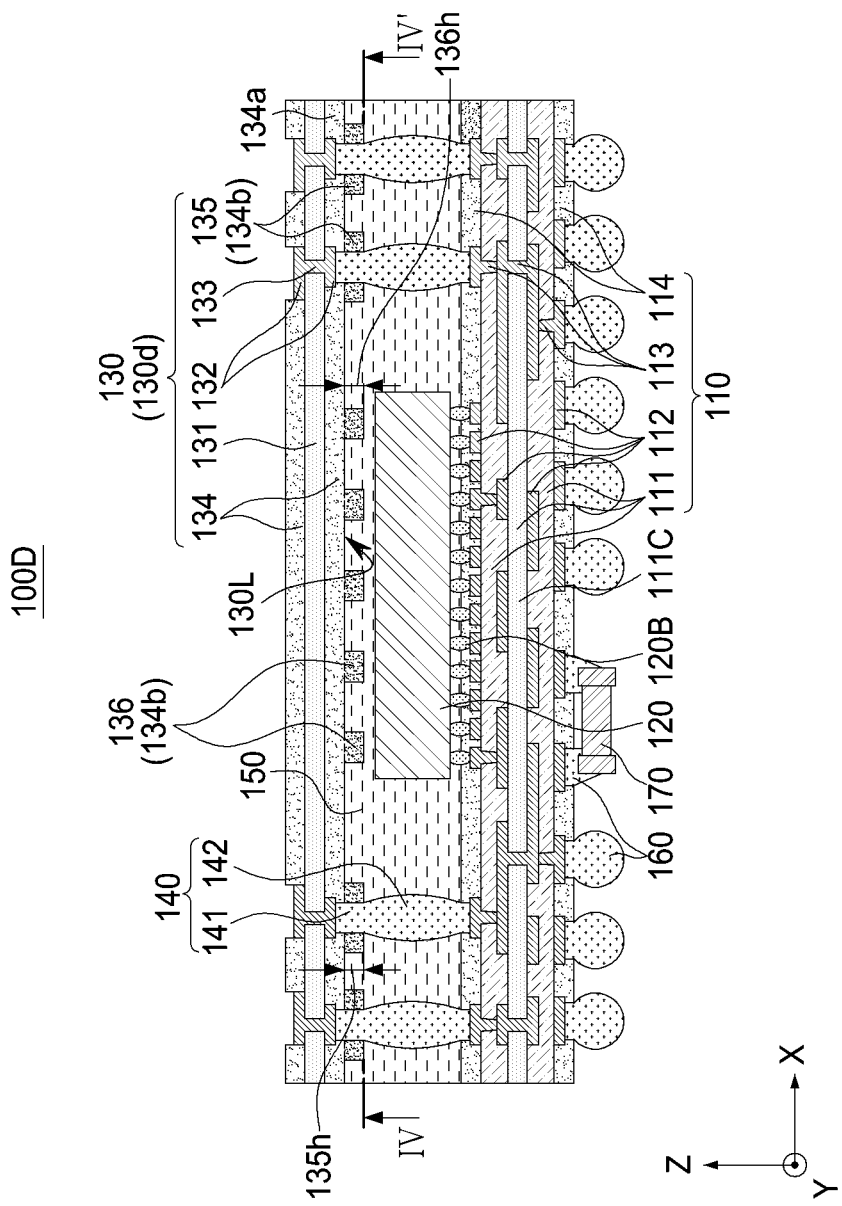
FIG. 4A is a cross-sectional view illustrating a semiconductor package according to an exemplary embodiment of the present inventive concept.
Figure 4B:
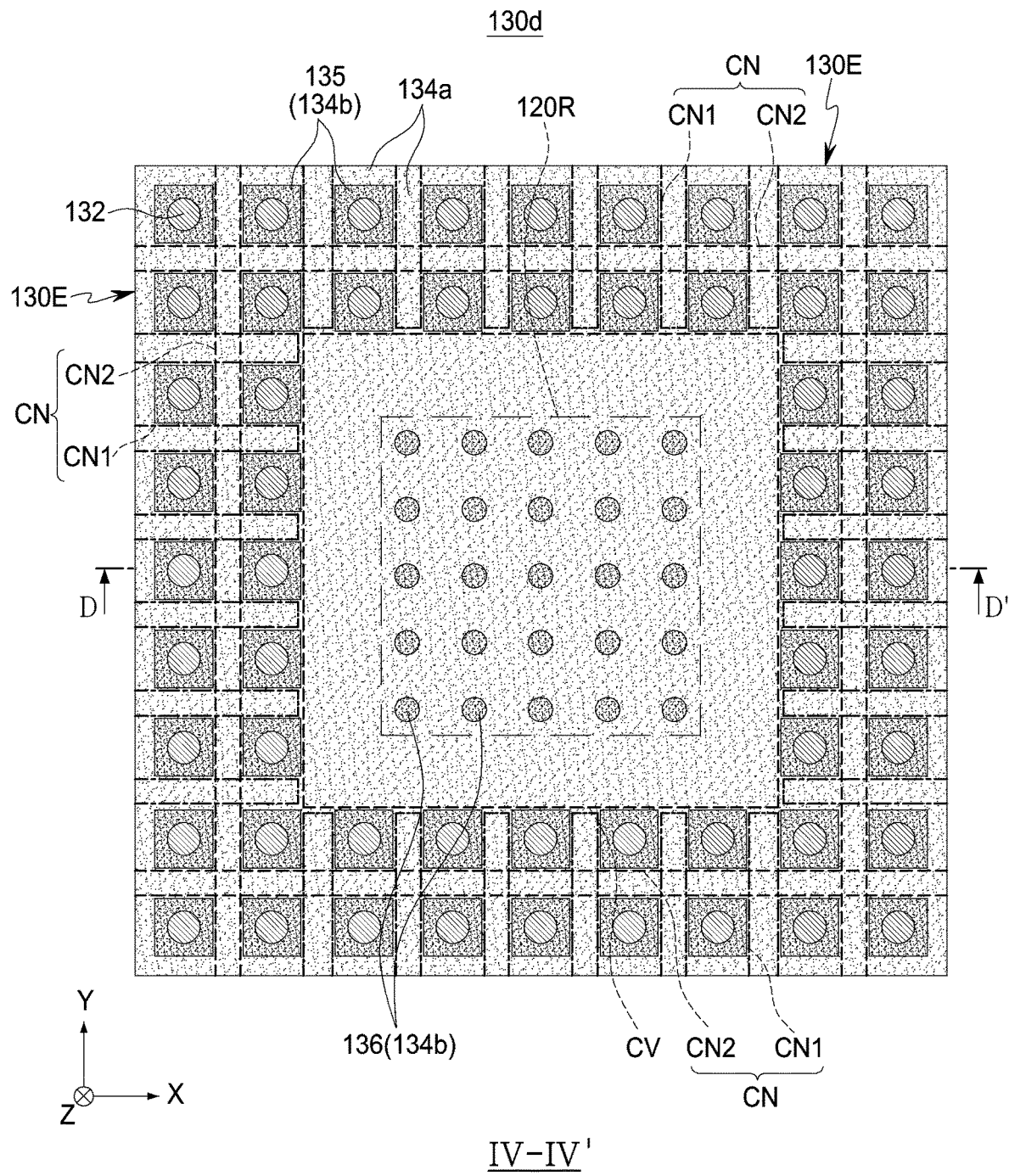
FIG. 4B is a plan view taken along line IV-IV' of FIG. 4A.

FIG. 4A is a cross-sectional view of a semiconductor package 100D according to an exemplary embodiment of the present inventive concept, and FIG. 4B is a plan view taken along line IV-IV' of FIG. 4A. FIG. 4B illustrates a lower surface 130L of an upper substrate 130d, similar to FIG. 1C, to illustrate a dispositional relationship of a plurality of patch structures 136. FIG. 4A is a cross-section of the upper substrate 130d taken along line D-D' of FIG. 4B.

Referring to FIGS. 4A and 4B, the semiconductor package 100D according to an exemplary embodiment has the same or similar characteristics as those described with reference to FIGS. 1A to 3B, except that the semiconductor package 100D includes a plurality of patch structures 136 that protrude from the lower surface 130L of the upper substrate 100d. For example, the upper substrate 130d includes a plurality of patch structures 136 located to overlap the semiconductor chip 120 in the cavity region CV, and that protrude from the lower surface 130L. The plurality of patch structures 136 control warpage of the upper substrate 130d. For example, when the upper substrate 130s excessively bends during a manufacturing process of the semiconductor package 100D, by supporting the upper substrate 130d while in contact with the upper surface of the semiconductor chip 120, the warpage of the upper substrate 130d can be controlled, and a non-wet risk of a connection structure 140 disposed outside of the support substrate 130 is reduced. Accordingly, according to an exemplary embodiment, a portion of the patch structures 136 may contact the upper surface of the semiconductor chip 120. The plurality of patch structures 136 are formed in a same step as the plurality of protruding structures 135. For example, when the plurality of protruding structures 135 are formed by patterning the second solder resist layer 134b of the lower surface 130L of the upper substrate 100d, the plurality of patch structures are also provided by patterning the second solder resist layer 134b. Accordingly, the plurality of patch structures 136 have a height 136h that is substantially equal to a height 135h of the plurality of protruding structures 135, but embodiments are not limited thereto. The plurality of patch structures 136 have a height 136h that is less or greater than the height 135h of the plurality of protruding structures 135. For example, the plurality of patch structures 136 are provided in a number smaller than that of the plurality of protruding structures 135. In this case, the plurality of patch structures 136 have a pitch greater than that of the plurality of protruding structures 135.

Figure 5A:
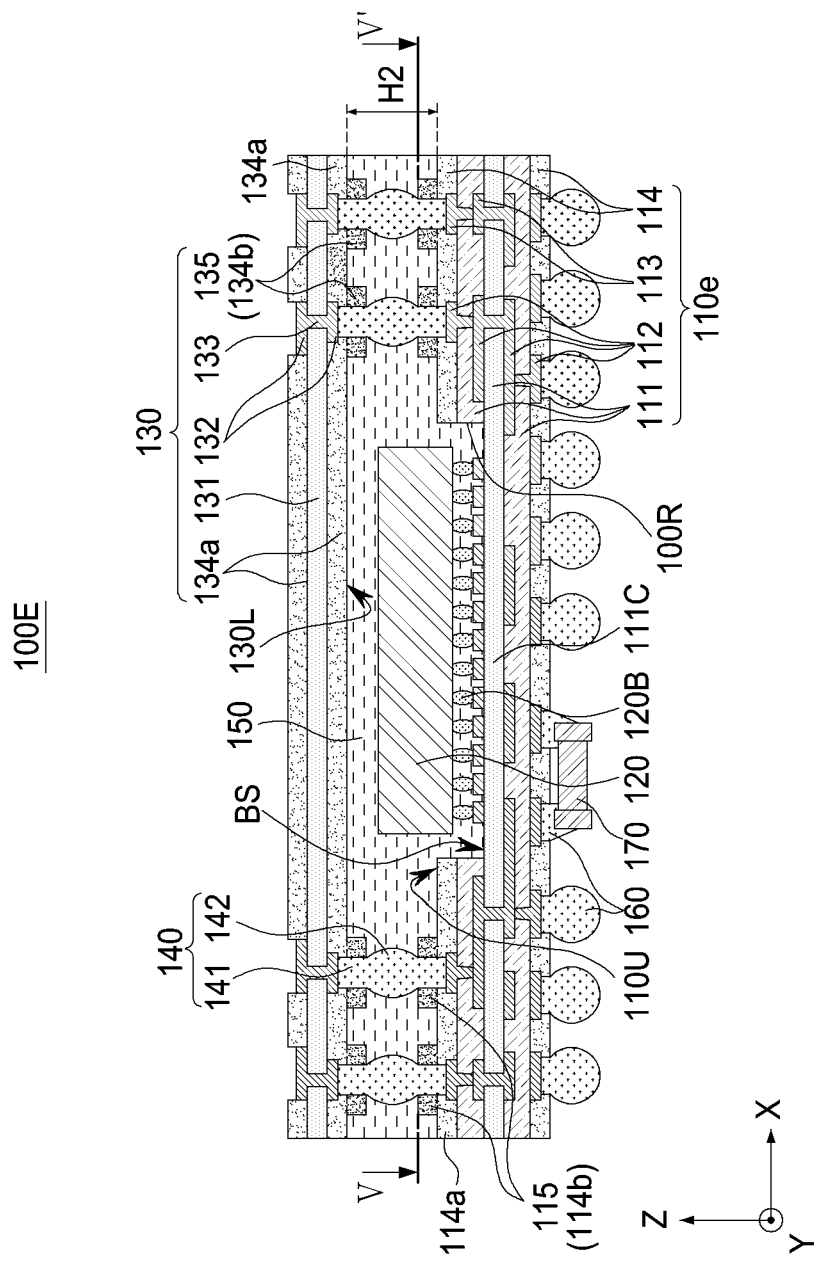
FIG. 5A is a cross-sectional view of a semiconductor package according to an exemplary embodiment of the present inventive concept.
Figure 5B:
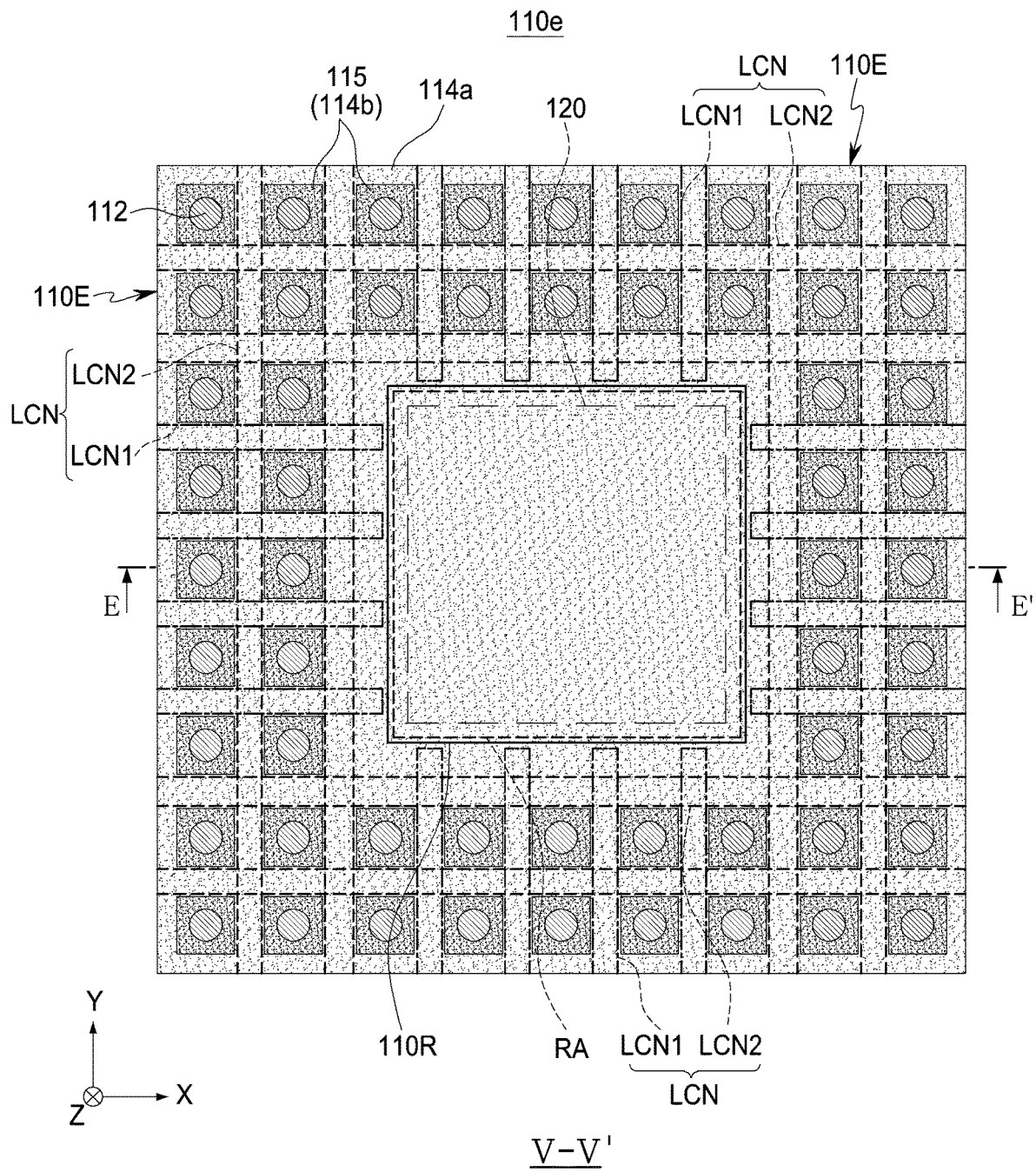
FIG. 5B is a plan view taken along line V-V' of FIG. 5A.

FIG. 5A is a cross-sectional view of a semiconductor package 100E according to an exemplary embodiment of the present inventive concept, and FIG. 5B is a plan view taken along line V-V' of FIG. 5A. FIG. 5B illustrates an upper surface 110U of a lower substrate 110e to illustrate a dispositional relationship between a recess area RA and the plurality of lower channel regions LCN. FIG. 5A is a cross-section of the lower substrate 110e taken along line E-E' of FIG. 5B.

Referring to FIGS. 5A and 5B, the semiconductor package 100E according to an exemplary embodiment has the same or similar characteristics as those described with reference to FIGS. 1A to 4B except that a recess region RA and a plurality of channel regions LCN are formed on an upper surface 110U of a lower substrate 110e. For example, the lower substrate 110e has an upper surface 110U that includes a recess 110R in which the semiconductor chip 120 is mounted, and a bottom surface BS of the recess 110R is located at a lower level than the upper surface 110U of the lower substrate 110e. Accordingly, in the semiconductor package 100E according to an exemplary embodiment, a height H2 between the upper substrate 130 and the lower substrate 110e is further reduced.

In addition, a plurality of lower channel regions LCN that provide a distribution path for a cleaning solution of impurities, such as a flux residue in the recess region 110R, and an encapsulant 150 is formed on an upper surface 110U of a lower substrate 110e. For example, the lower substrate 110e includes a plurality of lower protruding structures 115 that protrude from an upper surface 110U, and the upper surface 110U of the lower substrate 110e further includes the recess region RA that corresponds to the recess 110R, and a plurality of lower channel regions LCN that pass between the plurality of lower protruding structures 115 and extend from the recess region RA to an edge 110E of the lower substrate 110e.

The plurality of lower channel regions LCN are defined by the plurality of lower protruding structures 115, similar to those described with reference to FIGS. 1A to 1D. In addition, the plurality of lower channel regions LCN include a plurality of first lower channel regions LCN1 that extend from the recess region RA to the edge 110E of the lower substrate 110e, and a plurality of second lower channel regions LCN2 that intersect the plurality of first lower channel regions LCN1. In particular, the plurality of lower channel regions LCN have the same or similar characteristics as the plurality of channel regions CN in a similar range. In a present exemplary embodiment, a plurality of lower protruding structures 115 are formed by patterning a plurality of solder resist layers 114a and 114b that are sequentially stacked on the upper surface 110U of the lower substrate 110e. For example, the lower substrate 110e includes a first lower solder resist layer 114a disposed on the insulating layer 111 and that provides an upper surface 110U of the lower substrate 110e, and a second lower solder resist layer 114b disposed on the first lower solder resist layer 114a, i.e., on the upper surface 110U of the lower substrate 110e, and that provides a plurality of lower protruding structures 115. In this case, the recess area RA corresponds to the recess 110R in which the semiconductor chip 120 is accommodated. In addition, the plurality of lower channel regions LCN extend from the recess region RA and separate the second lower solder resist layer 114b into the plurality of lower protruding structures 115, and have a trench shape that exposes the first lower solder resist layer 114a or the insulating layer 111 thereunder. According to a present exemplary embodiment, a joint pitch between the lower substrate 110e and the upper substrate 130 is further reduced, and the quality of the encapsulant 150 can be secured.

Figure 6:
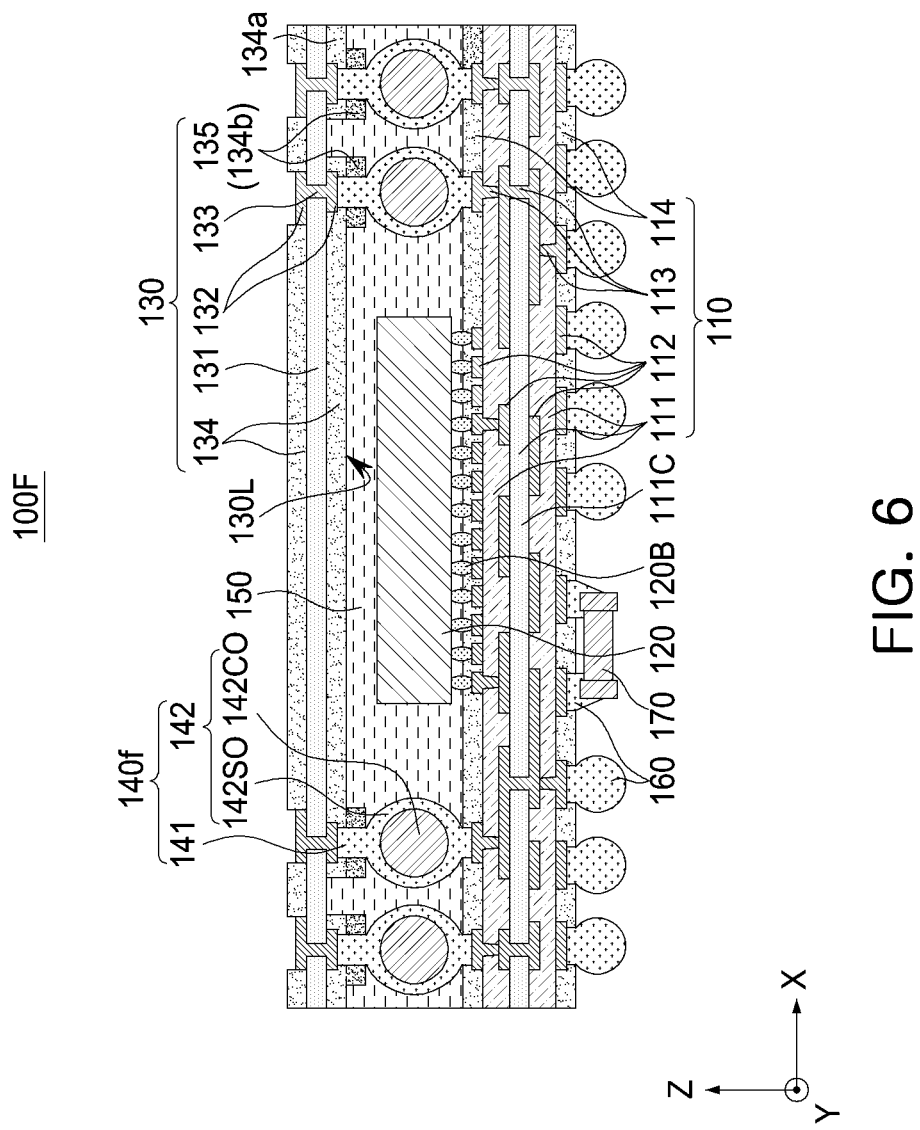
FIG. 6 is a cross-sectional view of a semiconductor package according to an exemplary embodiment of the present inventive concept.

FIG. 6 is a cross-sectional view of a semiconductor package 100F according to an exemplary embodiment of the present inventive concept.

Referring to FIG. 6, the semiconductor package 100F according to an exemplary embodiment has the same or similar characteristics as those described with reference to FIGS. 1A to 5B, except that a body portion 142 of a connection structure 140f includes a core 142CO and a solder layer 142SO that covers a surface of the core 142CO. For example, the connection structure 140f has a core ball structure that includes a core 142CO formed in a center and a solder layer 142SO that covers the core 142CO. The core (142CO) includes a polymer material that includes at least one of a thermosetting resin, a thermosetting resin, or a metal other than a solder. The solder layer 142SO includes tin (Sn) or an alloy that includes tin (Sn).

Figure 7:
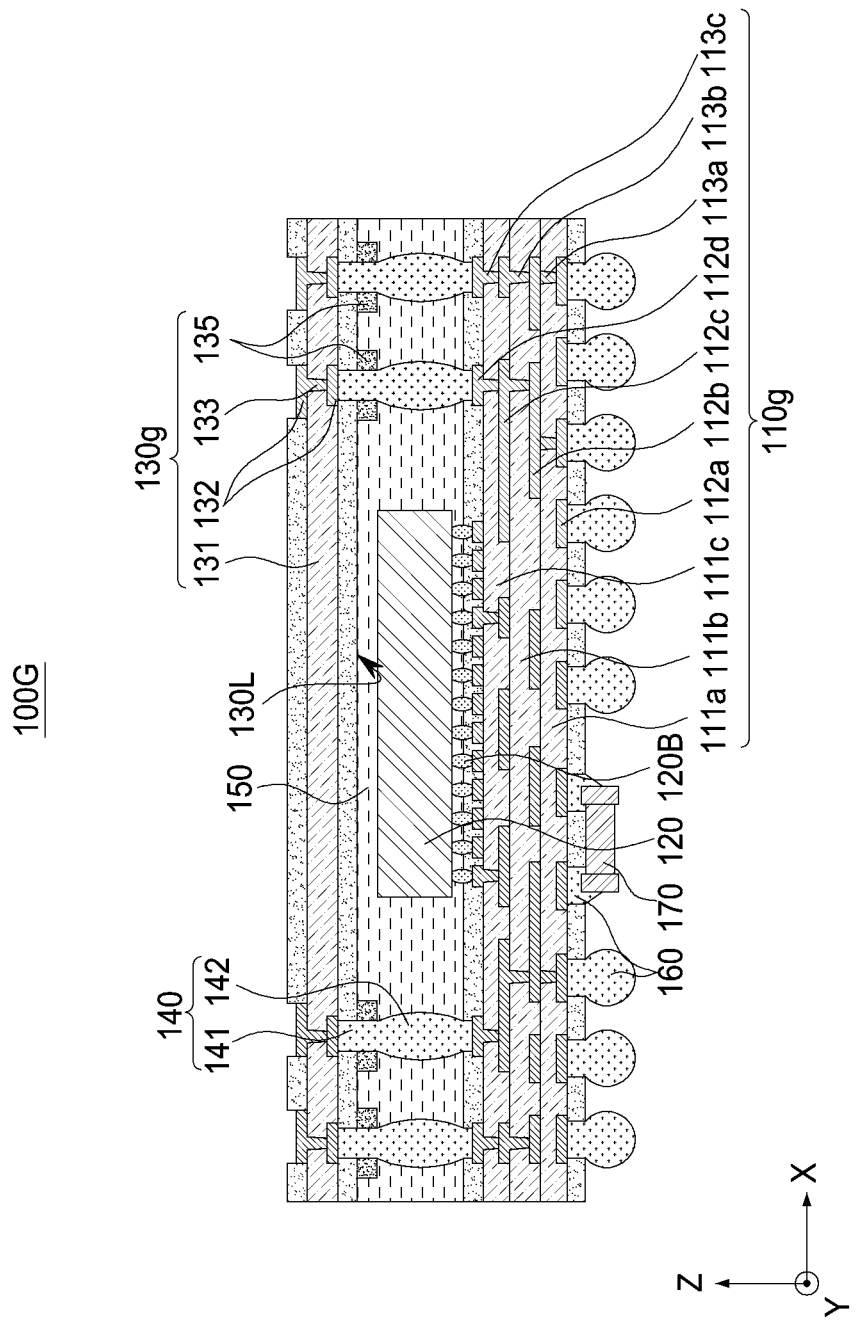
FIG. 7 is a cross-sectional view of a semiconductor package according to an exemplary embodiment of the present inventive concept.

FIG. 7 is a cross-sectional view of a semiconductor package 100G according to an exemplary embodiment of the present inventive concept.

Referring to FIG. 7, the semiconductor package 100G according to an exemplary embodiment has the same or similar characteristics as those described with reference to FIGS. 1A to 6, except that the semiconductor package 100G includes a lower substrate 110g and an upper substrate 130g that do not include a core insulating layer. The lower substrate 110g includes a first lower wiring layer 112a, a first lower insulating layer 111a that covers the first lower wiring layer 112a, a second lower wiring layer 112b disposed on the first lower insulating layer 111a, a second lower insulating layer 111b disposed on the first lower insulating layer 111a and that covers the second lower wiring layer 112b, a third lower wiring layer 112c disposed on the second lower insulating layer 111b, a third lower insulating layer 111c disposed on the second lower wiring layer 111b and that covers the third lower wiring layer 112c, a fourth lower wiring layer 112d disposed on the third lower insulating layer 111c, and first to third lower wiring vias 113a, 113b, and 113c that respectively penetrate through the first to third lower insulating layers 111a, 111b, and 111c and electrically connect the first to fourth lower wiring layers 112a, 112b, 112c, and 112d. For example, the first to third lower insulating layers 111a, 111b, and 111c include a photosensitive resin, such as PID, and a thickness of the lower substrate 110g is thinner than a substrate that includes a core insulating layer, and the lower wiring layers 112a, 112b, 112c, and 112d can be formed with a fine pitch. The number of layers of the lower insulating layers 111a, 111b, 111c and the lower wiring layers 112a, 112b, 112c, and 112d is not particularly limited, and may include more or fewer layers than that shown in the drawings. Similar to the lower substrate 110g, the upper substrate 130g is also formed by stacking photosensitive resins. According to a present exemplary embodiment, the thicknesses of the lower substrate 110g and the upper substrate 130g are reduced, and the overall thickness of the semiconductor package 100G is further reduced.

Figure 8:
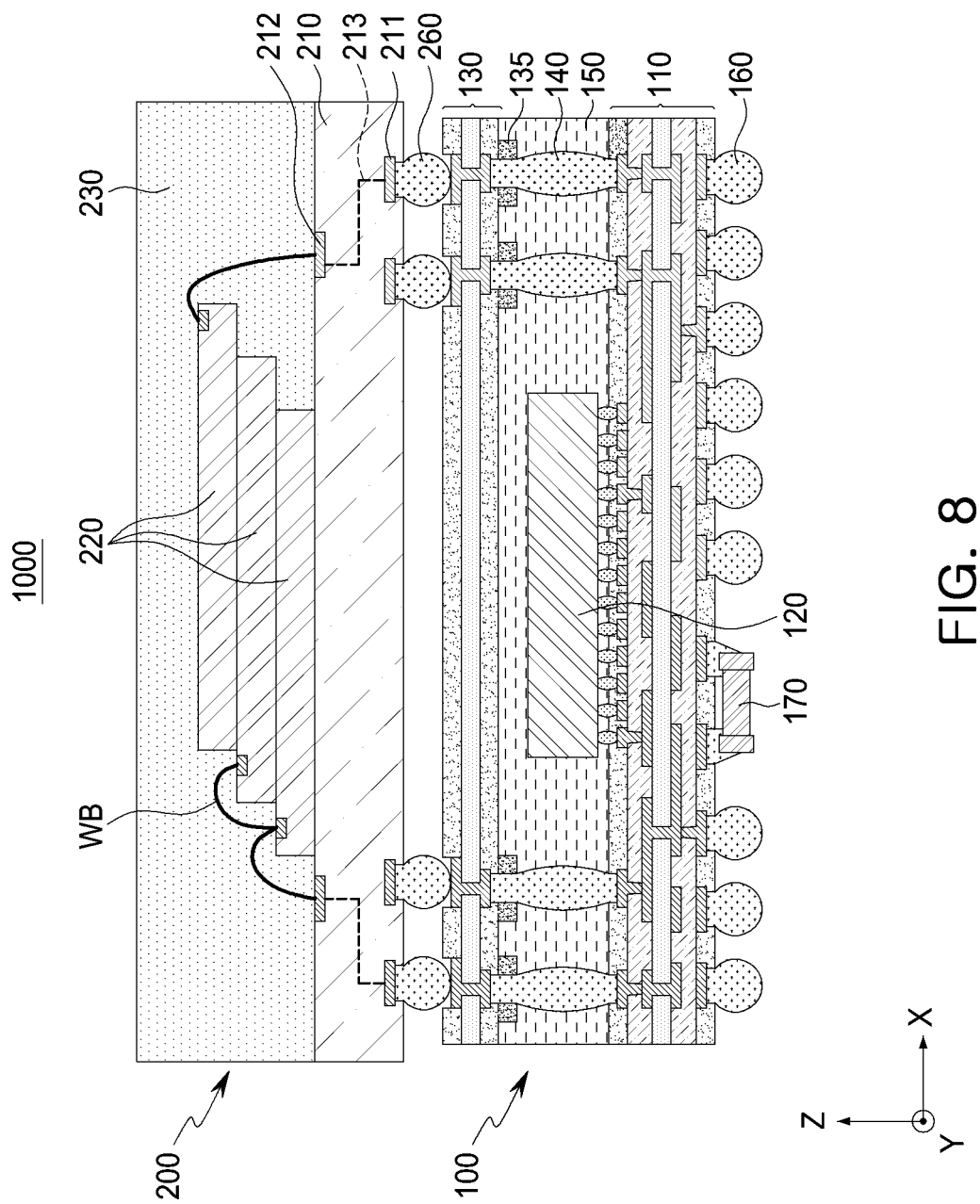
FIG. 8 is a cross-sectional view of a semiconductor package according to an exemplary embodiment of the present inventive concept.

FIG. 8 is a cross-sectional view of a semiconductor package 1000 according to an exemplary embodiment of the present inventive concept.

Referring to FIG. 8, the semiconductor package 1000 according to an exemplary embodiment includes a first package 100 and a second package 200. The first package 100 is illustrated in the same manner as the semiconductor package 100A illustrated in FIGS. 1A to 1C, but it may be understood that the semiconductor packages 100A, 100B, 100C, 100D, 100E, 100F, and 100G have the same or similar characteristics as those described with reference to FIGS. 1A to 7.

The second package 200 includes a redistribution substrate 210, a second semiconductor chip 220, and a second encapsulant 230. The redistribution substrate 210 includes a lower pad 211 and an upper pad 212 that have external electrical connections on a lower surface and an upper surface thereof, respectively. In addition, the redistribution substrate 210 includes a redistribution circuit 213 that electrically connects the lower pad 211 and the upper pad 212.

The second semiconductor chip 220 is mounted on the redistribution substrate 210 by a wire bonding or flip-chip bonding method. For example, a plurality of second semiconductor chips 220 are stacked in a vertical direction on the redistribution substrate 210, and are electrically connected to the upper pad 212 of the redistribution substrate 210 by a bonding wire WB. For example, the second semiconductor chip 220 is a memory chip, and the first semiconductor chip 120 is an AP chip.

The second encapsulant 230 includes a material that is the same as or similar to the first encapsulant 150 of the first package 100. The second package 200 is physically and electrically connected to the first package 100 by a metal bump 260. The metal bump 260 is electrically connected to the redistribution circuit 213 inside the redistribution substrate 210 through the lower pad 211 of the redistribution substrate 210. The metal bump 260 is made of a low-melting point metal, such as tin (Sn) or an alloy that includes tin (Sn).

The semiconductor package 1000 according to an exemplary embodiment includes a connection structure 140 that has a fine pitch, and a first package 100 that has an filling state of the encapsulant 150, and a reduced overall thickness. Accordingly, according to an exemplary embodiment of the present inventive concept, a package-on-package structure that has a reduced thickness and is reliable can be implemented.

Hereinafter, with reference to FIGS. 9A to 9D and 10A to 10D, a manufacturing process of a semiconductor package according to an exemplary embodiment of the present inventive concept will be mainly described with reference to a manufacturing process of the upper substrate 130 and the connection structure 140.

FIGS. 9A to 9D are cross-sectional views sequentially illustrating a manufacturing process of the upper substrate 130 illustrated in FIGS. 1A to 1C.

Figure 9A:
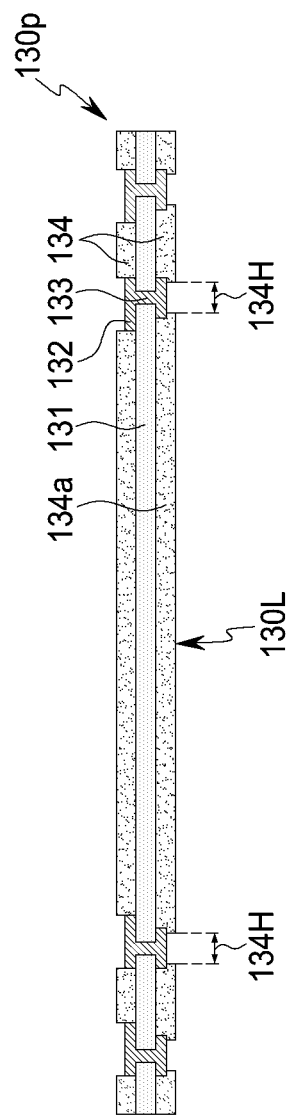
FIGS. 9A to 9D are cross-sectional views that sequentially illustrate a manufacturing process of an upper substrate illustrated in FIGS. 1A to 1C.

Referring to FIG. 9A, in an embodiment, first, a preliminary upper substrate 130p is prepared on which an insulating layer 131, an upper wiring layer 132, a wiring via 133, and a solder resist layer 134 are formed. The insulating layer 131 is formed using, for example, a copper clad laminate. The upper wiring layer 132 and the wiring via 133 is formed on both surfaces of the insulating layer 131 using a photolithography process, a plating process, an etching process, etc. In addition, in other embodiments, a larger number of upper wiring layers can be formed by stacking additional insulating layers on both surfaces of the insulating layer 131. The solder resist layer 134 is formed to have an opening 134H that exposes a portion of the upper wiring layer 132 by applying a solder resist ink, such as PSR ink, and performing an exposure and development process. The preliminary upper substrate 130p has a lower surface 130L provided by a lower first solder resist layer 134a.

Figure 9B:
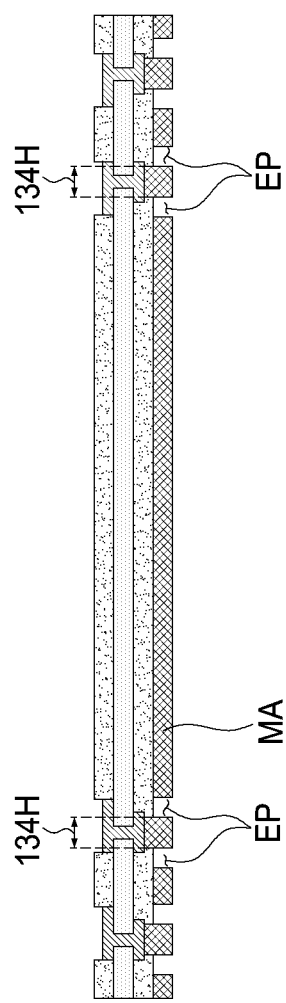

Referring to FIG. 9B, in an embodiment, a patterned mask layer MA is formed on the lower surface 130L of the preliminary upper substrate 130p. The mask layer MA includes an etching pattern EP that surrounds the opening 134H of the first solder resist layer 134a. The mask layer MA includes at least one of a thermosetting resin, a UV curable resin, or a composite curable resin, etc. Thereafter, a second solder resist layer is formed by filling the etching pattern EP of the mask layer MA with a solder resist ink, as shown in FIG. 9C.

Figure 9C:
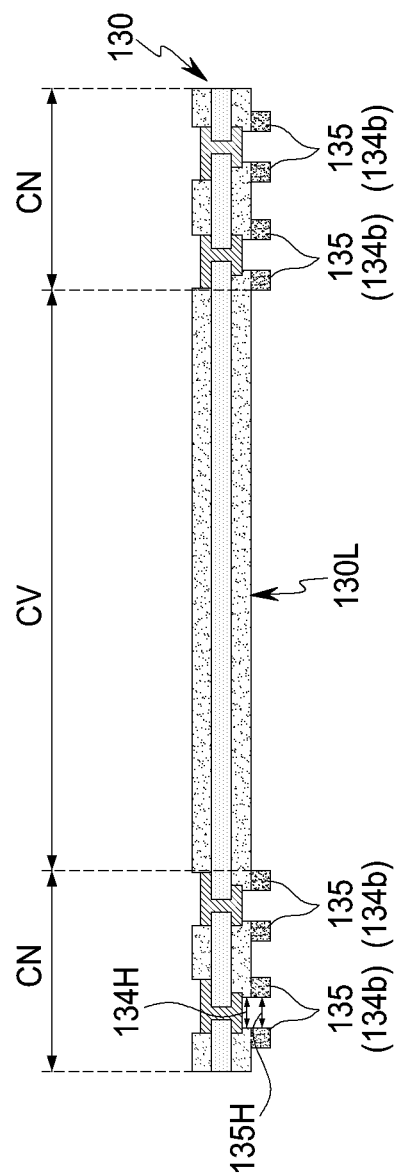

Referring to FIG. 9C, in an embodiment, an upper substrate 130 on which a second solder resist layer 134b is formed may be manufactured by filling the etching pattern EP with a solder resist ink and removing the mask layer MA. The second solder resist layer 134b is formed by applying a solder resist ink that includes at least one of an epoxy-based, a melamine-based, or an imidazole-based resin. The second solder resist layer 134b provides a protrusion structure 135 that corresponds to the etching pattern EP of FIG. 9B.

Accordingly, the second solder resist layer 134b or the protruding structure 135 has an opening 135H that corresponds to the opening 134H of the first solder resist layer 134a. In addition, the lower surface 130L of the upper substrate 130 includes a cavity region CV and a plurality of channel regions CN defined by the protruding structure 135. The protruding structure 135 protrudes downward from the lower surface 130L of the upper substrate 130 and reduces a joint pitch with a lower substrate 110, shown in FIG. 10A, in a process to be described below. According to an exemplary embodiment, the second solder resist layer 134b is formed using PSR. In this case, the second solder resist layer 134b or the protruding structure 135 are also formed by applying a PSR ink to an entire lower surface 130L of the lower substrate 130 and then performing an exposure and developing process.

Figure 9D:
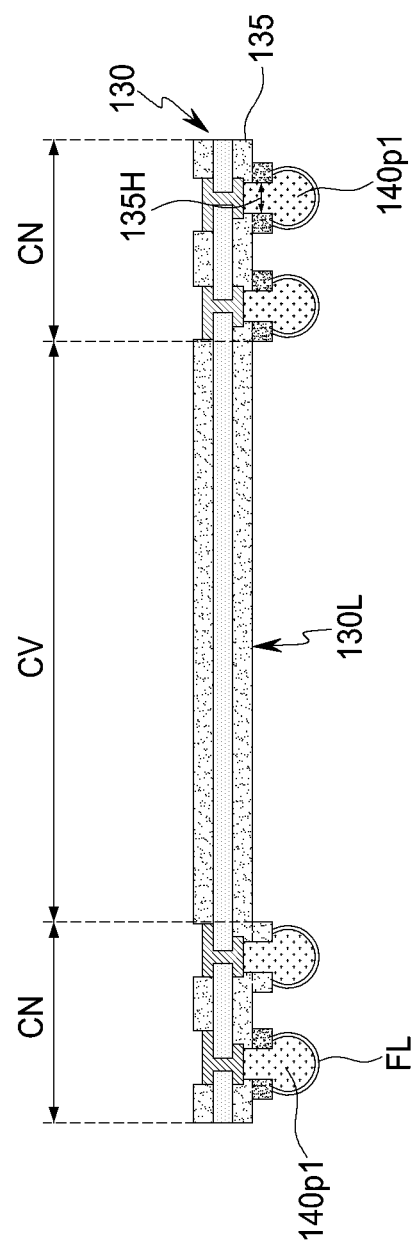

Referring to FIG. 9D, in an embodiment, a first preliminary connection structure 140p1 is formed in the opening 135H of the protruding structure 135. The first preliminary connection structure 140p1 is formed by applying a solder paste that contains tin (Sn) or an alloy that contains tin (Sn). After the first preliminary connection structure 140p1 is formed, a flux layer FL is formed. The flux layer FL is formed by applying a liquid or gel-type base material to a surface of the first preliminary connection structure 140p1, but is not limited thereto, and in other embodiments, the flux layer FL is included in the first preliminary connection structure 140p1. The flux layer FL prevents oxidation of the solder in a subsequent reflow process and improves wettability and spreadability.

FIGS. 10A to 10D are cross-sectional views that sequentially illustrate a manufacturing process of a semiconductor package 100A illustrated in FIGS. 1A to 1C.

Figure 10A:
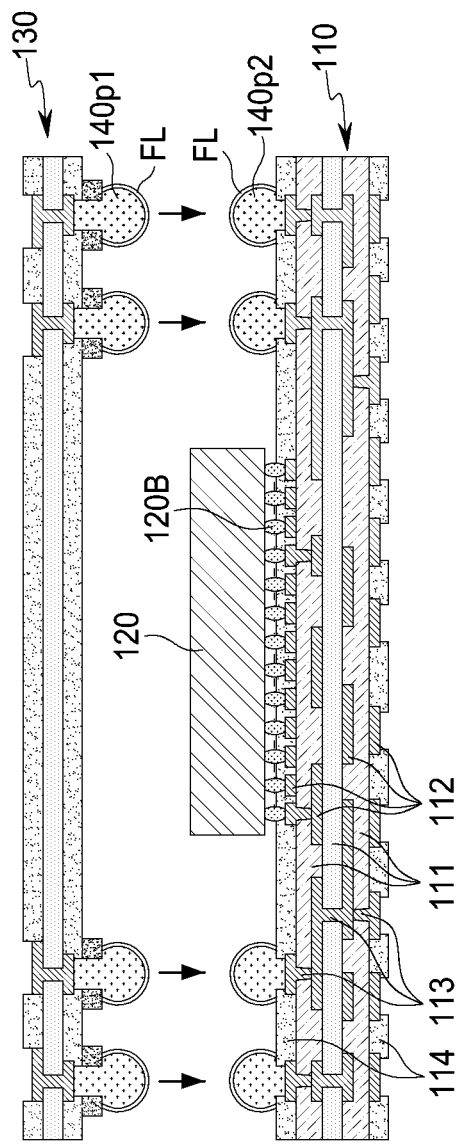
FIGS. 10A to 10D are cross-sectional views that sequentially illustrate a manufacturing process of a semiconductor package illustrated in FIGS. 1A to 1C.

Referring to FIG. 10a, in an embodiment, the upper substrate 130 of FIG. 9D is attached to a lower substrate 110 on which the semiconductor chip 120 is mounted. The lower substrate 110 includes a second preliminary connection structure 140p2 and a flux layer FL. The second preliminary connection structure 140p2 and the flux layer FL have the same characteristics as the first preliminary connection structure 140p1 and the flux layer FL described with reference to FIG. 9D. The upper substrate 130 is aligned on the lower substrate 110 so that the first preliminary connection structure 140p1 and the second preliminary connection structure 140p2 overlap in a first (Z-axis) direction. Since the first preliminary connection structure 140p1 and the second preliminary connection structure 140p2 are close to each other by a height of the protrusion structure 135, even when a volume of the first preliminary connection structure 140p1 and the second preliminary connection structure 140p2 is small, due to, e.g., a small amount of solder paste being applied thereto, a non-wet phenomenon of the first preliminary connection structure 140p1 and the second preliminary connection structure 140p2 is prevented, and a pitch of the connection structure 140 is reduced.

Figure 10B:
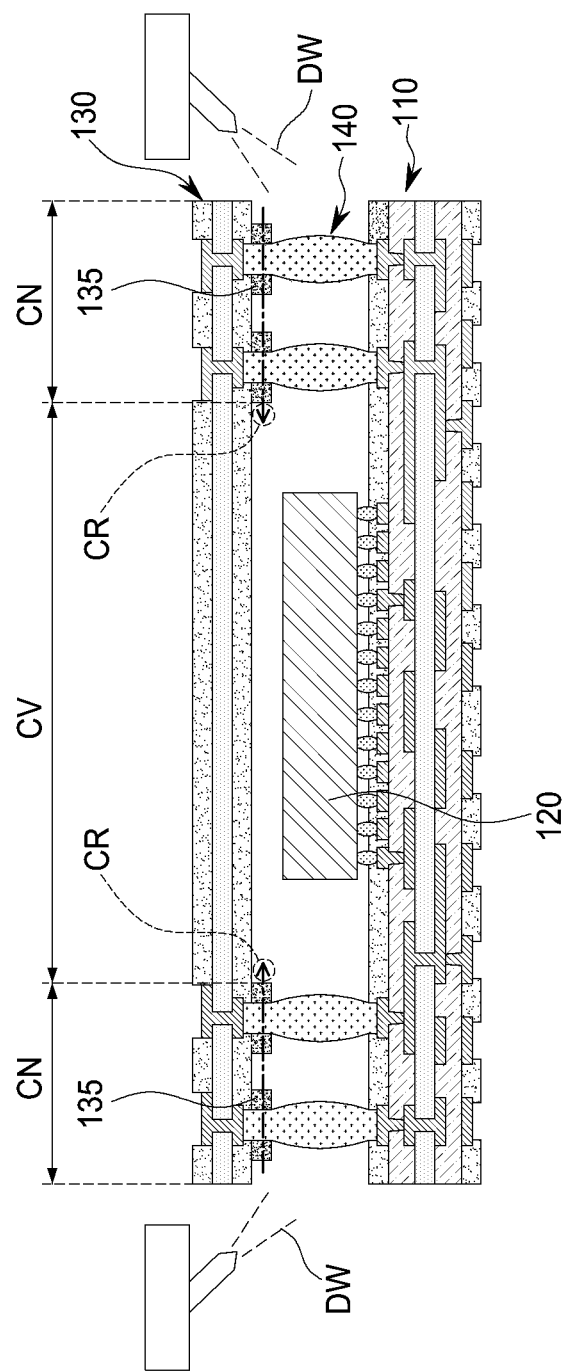

Referring to FIG. 10B, in an embodiment, a cleaning process that forms a connection structure 140 and removes a flux residue is performed. The connection structure 140 is formed using a reflow process. In an embodiment of the present inventive concept, since a joint pitch between a lower substrate 110 and an upper substrate 130 is reduced by a protruding structure 135, a connection structure 140 having a fine pitch can be implemented. After the reflow process, a cleaning solution DW, such as purified water, is introduced between the lower substrate 110 and the upper substrate 130 to remove the flux residue. According to an embodiment of the present inventive concept, by securing a distribution path of the cleaning solution DW through a plurality of channel regions CN that pass between a plurality of protruding structures 135, any flux that remains in a corner portion CR of a cavity region CV can be effectively removed. When no channel regions CN are formed between the plurality of protrusion structures 135, the cleaning solution DW might not reach the corner portion CR of the cavity region CV due to step differences of the protruding structure 135, and the flux residue that remains in this portion deteriorates the quality of the encapsulant to be filled thereafter.

Figure 10C:
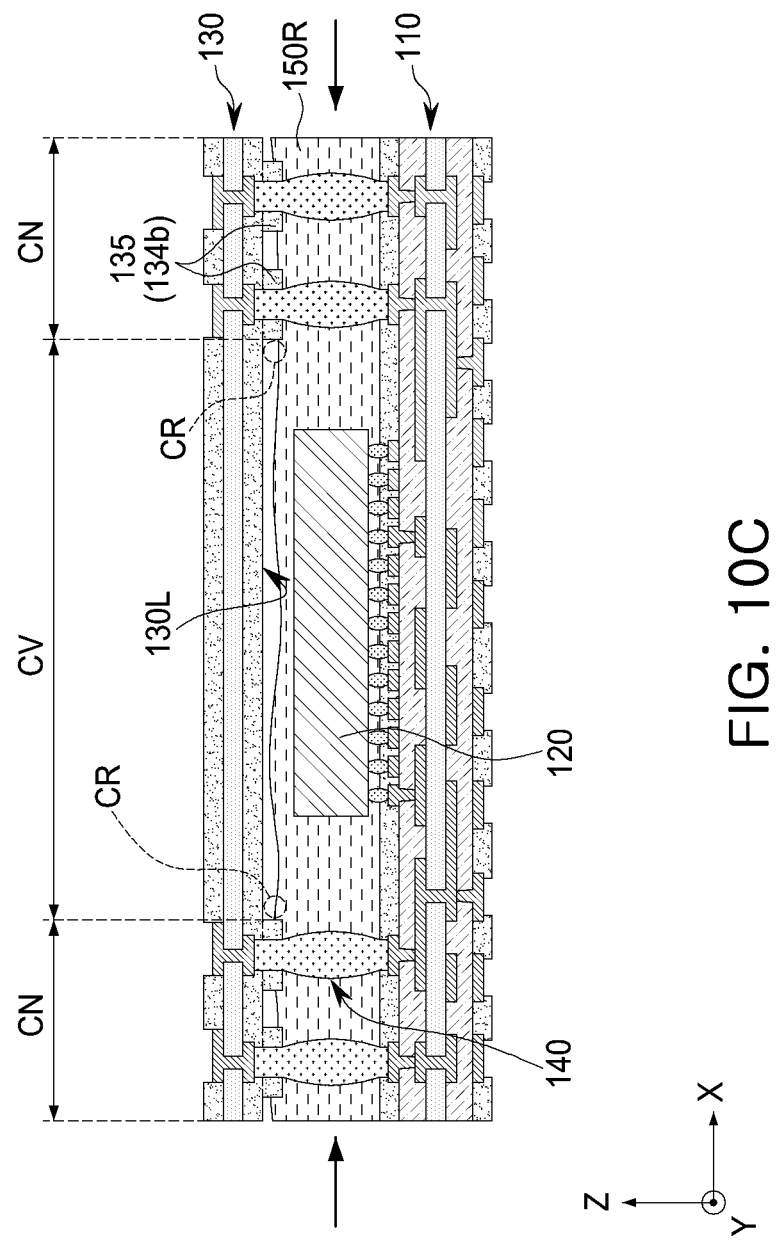
Figure 10D:
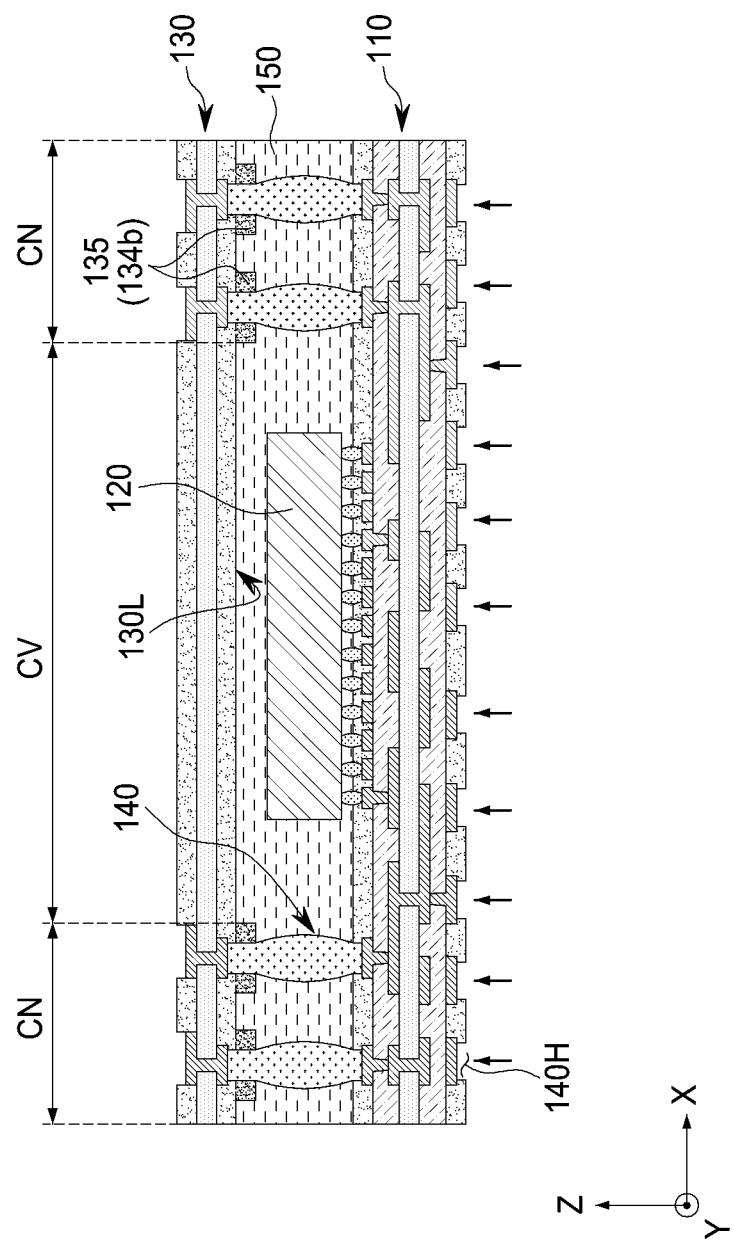

Referring to FIG. 10C, in an embodiment, an encapsulant 150 in FIG. 10D is formed by injecting a molding resin 150R between the lower substrate 110 and the upper substrate 130. The molding resin 150R includes a liquid or gel-type insulating resin, such as EMC. In an embodiment of the present inventive concept, as described above, filling properties of the molding resin 150R are improved by effectively removing the flux residue. In addition, by securing a filling path for the molding resin 150R through the plurality of channel regions CN that pass between the plurality of protruding structures 135, a molding resin 150R fills into corner portions that form due to step differences with the protruding structure 135. When no channel regions CN are formed between the plurality of protrusion structures 135, the molding resin 150R might not fill the corner portion CR of the cavity region CV.

Referring to FIG. 10D, in an embodiment, after forming the encapsulant 150 that fills a space between the lower substrate 110 and the upper substrate 130, connection bumps 160 in FIG. 1A and/or passive elements 170 in FIG. 1A are mounted on a plurality of openings 140H on a lower surface of the lower substrate 110 to complete the semiconductor package. The encapsulant 150 is formed by curing the molding resin 150R filled in the process of FIG. 10C. Connection bumps 160 in FIG. 1A and/or passive devices 170 in FIG. 1A are mounted on the lower surface of the lower substrate 110 in a flip-chip manner.

As described above, in embodiments of the present inventive concept, by securing a distribution path of the cleaning solution DW and the molding resin 150R through the plurality of channel regions CN that pass between the plurality of protruding structures 135, the flux residue from the corner portion CR of the cavity region CV is effectively removed and the filling properties of the molding resin 150R are improved. In addition, by introducing the plurality of protruding structures 135, the pitch of the connection structures 140 is reduced and the overall thickness of the semiconductor package is reduced.

As set forth above, according to exemplary embodiments of the present inventive concept, a semiconductor package that has a reduced thickness is provided by introducing an upper substrate that includes a cavity region.

In addition, by introducing a channel region that extends from the cavity region to an edge of the upper substrate, a semiconductor package having increased encapsulant quality is provided.

While exemplary embodiments have been shown and described above, it will be apparent to those skilled in the art that modifications and variations could be made without departing from the scope of exemplary embodiments of the present inventive concept as defined by the appended claims.

What is claimed is:

1. A semiconductor package, comprising:
a lower substrate that includes a lower wiring layer;
a semiconductor chip disposed on the lower substrate, wherein the semiconductor chip is electrically connected to the lower wiring layer;
an upper substrate disposed on the semiconductor chip, wherein the upper substrate includes a lower surface that faces the semiconductor chip, an upper wiring layer, and a plurality of protruding structures disposed below the lower surface;
a connection structure disposed between the lower substrate and the upper substrate, wherein the connection structure electrically connects the lower wiring layer and the upper wiring layer;
an encapsulant that fills a space between the lower substrate and the upper substrate, and seals at least a portion of each of the semiconductor chip and the connection structure; and
a connection bump disposed below the lower substrate, wherein the connection bump is electrically connected to the lower wiring layer,
wherein the lower surface of the upper substrate includes a cavity region that overlaps the semiconductor chip in a first direction that is perpendicular to the lower surface, and a plurality of channel regions that extend from the cavity region to an edge of the upper substrate,
wherein the cavity region and the plurality of channel regions are defined by the plurality of protruding structures.

2. The semiconductor package of claim 1, wherein the cavity region is surrounded by the plurality of protruding structures,
wherein the plurality of channel regions extend between the plurality of protruding structures and are spaced apart from each other.

3. The semiconductor package of claim 1, wherein the upper substrate further comprises a first solder resist layer that provides the lower surface, and a second solder resist layer disposed below the first solder resist layer and that provides the plurality of protruding structures.

4. The semiconductor package of claim 3, wherein the upper substrate further comprises an insulating layer on which the upper wiring layer is disposed,
wherein the first and second solder resist layers are sequentially stacked below the insulating layer,
wherein the plurality of channel regions expose the first solder resist layer or the insulating layer in the first direction.

5. The semiconductor package of claim 1, wherein the lower surface of the upper substrate has a first surface that corresponds to the cavity region and a second surface that corresponds to the plurality of channel regions,
wherein the first surface and the second surface are substantially coplanar.

6. The semiconductor package of claim 1, wherein the lower surface of the upper substrate has a first surface that corresponds to the cavity region and a second surface that corresponds to the plurality of channel regions,
wherein the second surface is located higher than the first surface.

7. The semiconductor package of claim 1, wherein at least a portion of the plurality of protruding structures include an opening that exposes at least a portion of the upper wiring layer,
wherein the connection structure is disposed below the exposed portion of the plurality of protruding structures, and is electrically connected to the upper wiring layer through the opening.

8. The semiconductor package of claim 7, wherein the connection structure includes a contact portion that fills the opening, and a body portion that extends from the contact portion to an upper surface of the lower substrate,
wherein the body portion has a convex side surface that has a maximum width in a second direction that is perpendicular to the first direction that is greater than a maximum width of the contact portion.

9. The semiconductor package of claim 1, wherein, in the first direction, a height from an upper surface of the upper substrate to the lower surface thereof is from about 0.075 mm to about 0.085 mm,
a height between the upper substrate and the lower substrate is from about 0.135 mm to about 0.165 mm,
a height from an upper surface of the lower substrate to a lower surface thereof is from about 0.085 mm to about 0.095 mm, and
a height of the connection bump is from about 0.125 mm to about 0.135 mm.

10. The semiconductor package of claim 9, wherein, in the first direction, a height of the plurality of protruding structures is in a range of from about 0.01 mm to about 0.02 mm.

11. The semiconductor package of claim 1, wherein the upper substrate further includes a plurality of patch structures that protrude from the lower surface, wherein the plurality of patch structures are located in the cavity region and overlap the semiconductor chip.

12. A semiconductor package, comprising:
a lower substrate that includes a lower wiring layer;
a semiconductor chip disposed on the lower substrate, wherein the semiconductor chip is electrically connected to the lower wiring layer;
an upper substrate disposed on the semiconductor chip, wherein the upper substrate includes a lower surface that faces the semiconductor chip, an upper wiring layer, and a plurality of protruding structures disposed below the lower surface; and
a connection structure disposed between the lower substrate and the upper substrate, wherein the connection structure electrically connects the lower wiring layer and the upper wiring layer,
wherein the lower surface of the upper substrate includes a cavity region surrounded by the plurality of protruding structures, and a plurality of channel regions that extend from the cavity region to an edge of the upper substrate and pass between the plurality of protruding structures.

13. The semiconductor package of claim 12, wherein the plurality of channel regions include a plurality of first channel regions that extend from the cavity region toward the edge of the upper substrate.

14. The semiconductor package of claim 13, wherein the plurality of first channel regions have a line width in a range of from about 2 μm to about 50 μm.

15. The semiconductor package of claim 13, wherein the plurality of channel regions further include a plurality of second channel regions that intersect the plurality of first channel regions.

16. The semiconductor package of claim 12, wherein the cavity region has a planar area that is greater than a planar area of the semiconductor chip,
wherein the semiconductor chip is located in the cavity region.

17. A semiconductor package, comprising:
a lower substrate;
a semiconductor chip disposed on the lower substrate;
an upper substrate disposed on the semiconductor chip, wherein the upper substrate includes a lower surface that faces the semiconductor chip, and a plurality of protruding structures disposed below the lower surface, wherein the plurality of protruding structures do not overlap the semiconductor chip in a first direction that is perpendicular to the lower surface; and
a connection structure disposed below the plurality of protruding structures, wherein the connection structure extends in the first direction and electrically connects the upper substrate and the lower substrate,
wherein the lower surface of the upper substrate includes a cavity region that is surrounded by the plurality of protruding structures, and a plurality of first channel regions that extend from the cavity region toward an edge of the upper substrate and that pass between the plurality of protruding structures.

18. The semiconductor package of claim 17, wherein the lower surface of the upper substrate further includes a plurality of second channel regions that intersect the plurality of first channel regions.

19. The semiconductor package of claim 18, wherein at least one of each of the plurality of first and second channel regions extends to the edge of the upper substrate.

* * * * *